(12) United States Patent
Gangal et al.

(10) Patent No.: US 12,406,916 B2
(45) Date of Patent: Sep. 2, 2025

(54) VIA PLUG CAPACITOR

(71) Applicant: Intel Corporation, Santa Clara, CA (US)

(72) Inventors: Santosh Gangal, Bangalore (IN); Tin Poay Chuah, Bayan Baru (MY)

(73) Assignee: Intel Corporation, Santa Clara, CA (US)

( * ) Notice: Subject to any disclaimer, the term of this patent is extended or adjusted under 35 U.S.C. 154(b) by 1023 days.

(21) Appl. No.: 17/204,592

(22) Filed: Mar. 17, 2021

(65) Prior Publication Data

US 2022/0302007 A1 Sep. 22, 2022

(51) Int. Cl.
| | | |
|---|---|---|
| *H01L 23/498* | (2006.01) | |
| *H01L 21/48* | (2006.01) | |
| *H01L 23/00* | (2006.01) | |
| *H05K 1/11* | (2006.01) | |
| *H05K 1/16* | (2006.01) | |
| *H10D 1/47* | (2025.01) | |
| *H10D 1/68* | (2025.01) | |

(52) U.S. Cl.
CPC ...... *H01L 23/49827* (2013.01); *H01L 21/486* (2013.01); *H01L 24/16* (2013.01); *H05K 1/113* (2013.01); *H05K 1/162* (2013.01); *H05K 1/167* (2013.01); *H10D 1/474* (2025.01); *H10D 1/696* (2025.01); *H01L 2224/16227* (2013.01); *H01L 2224/16238* (2013.01); *H01L 2924/15311* (2013.01)

(58) Field of Classification Search
CPC . H01L 23/49827; H01L 21/486; H01L 24/16; H01L 28/24; H01L 28/75; H01L 2224/16227; H01L 2224/16238; H01L 2924/15311; H01L 23/49822; H01L 23/50; H01L 23/647; H01L 21/52; H01L 23/642; H05K 1/113; H05K 1/162; H05K 1/167; H05K 1/115; H05K 3/4046; H05K 3/42; H05K 3/4053; H05K 3/3447
See application file for complete search history.

(56) References Cited

U.S. PATENT DOCUMENTS

| | | | |
|---|---|---|---|
| 8,502,340 B2 * | 8/2013 | Oganesian | H01L 28/40 257/532 |
| 8,742,541 B2 * | 6/2014 | Mohammed | H01L 28/91 257/532 |
| 2005/0244999 A1 | 11/2005 | Masuyama et al. | |
| 2012/0146182 A1 * | 6/2012 | Oganesian | H01L 28/91 257/532 |
| 2012/0181658 A1 * | 7/2012 | Mohammed | H01L 23/49822 257/532 |
| 2013/0015557 A1 * | 1/2013 | Yang | H01L 23/49822 257/532 |
| 2015/0294791 A1 * | 10/2015 | Hwang | H01G 4/30 29/25.03 |

(Continued)

*Primary Examiner* — Eliseo Ramos Feliciano
*Assistant Examiner* — Sophia W Kao
(74) *Attorney, Agent, or Firm* — Essential Patents Group, LLP

(57) ABSTRACT

Disclosed herein are via plug capacitors for incorporation into electronic substrates, and related methods and devices. Exemplary via plug capacitor structures include a capacitive element within a via extending at least partially through an electronic substrate and first and second electrodes coupled to the capacitive element.

21 Claims, 12 Drawing Sheets

(56) References Cited

U.S. PATENT DOCUMENTS

| | | | |
|---|---|---|---|
| 2015/0318112 A1* | 11/2015 | Kwag | H01G 4/248 |
| | | | 336/200 |
| 2017/0359893 A1* | 12/2017 | Goh | H05K 1/141 |
| 2019/0057949 A1* | 2/2019 | Hwang | H01L 21/6835 |
| 2019/0239358 A1* | 8/2019 | Bartley | H05K 3/4038 |

* cited by examiner

VIA PLUG CAPACITOR

BACKGROUND

The integrated circuit industry is continually striving to produce ever faster, smaller, and more efficient integrated circuit devices, packages, and systems for use in various electronic products, including, but not limited to, portable client devices, desktop client devices, server devices, and the like.

In current packages, a large number of surface mounted devices (SMDs), including surface mounted resistors and surface mounted capacitors, are employed in nearly every electronic device design and implementation. FIG. 1 illustrates a cross sectional view of an example prior art assembly 100 including example surface mounted devices 111, 112, 113 mounted on a printed circuit board 101. As shown, electrodes 103a, 103b of SMD 111 couple an active component 104 of SMD 111 to vias 105a, 105b, which are embedded in printed circuit board 101. SMD 111 may be coupled to landing pads and/or traces such as trace 107a on surface 106a, backside landing pads and/or traces such as trace 107b on surface 106b of printed circuit board 101, and/or traces within printed circuit board 101 using vias 105a, 105b. SMDs 112, 113 are mounted and integrated in assembly 100 in a similar manner Notably, the SMDs of assembly 100 include a variety of devices offering differing characteristics including resistors (at various resistance values) and capacitors (e.g., ceramic capacitors at various capacitance values).

Such SMDs result in an inflated bill of materials and overall higher production costs due to various processes involved in incorporating them inclusive of pick and place operations, solder operations, inventory management, and others. Furthermore, SMDs require a large footprint on assembly 100 (as indicated by distance d1), have relatively high failure rates, and difficulty in troubleshooting when failures arise.

It is with respect to these and other considerations that the present improvements have been needed. Such improvements may become critical as the desire to provide improved integrated circuit devices, packages, and systems becomes more widespread.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following detailed description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings and/or schematics, such that the advantages of the present disclosure can be more readily ascertained, in which:

DETAILED DESCRIPTION

Figure 1:
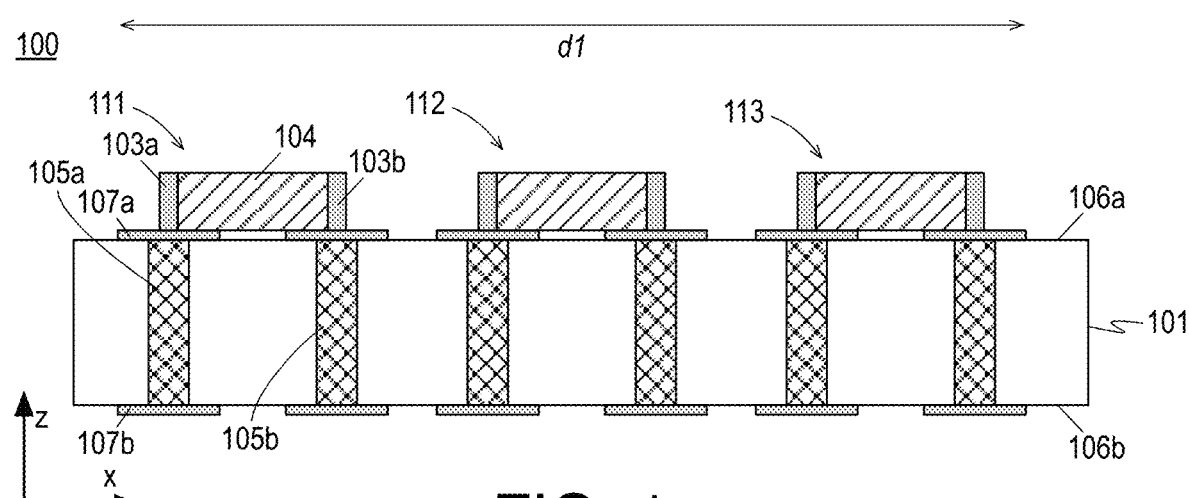
FIG. 1 illustrates a cross sectional view of an example prior art assembly including example surface mounted devices mounted on a printed circuit board.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers. One layer "on" another layer is in direct contact with the other layer absent any intervening layers.

The term "package" generally refers to a self-contained carrier of one or more dies, where the dies are attached to a package substrate, electronic substrate, or printed circuit board, and may be encapsulated for protection, with integrated or wire-bonded interconnects between the dies and leads, pins or bumps located on the external portions of the package substrate. The package may contain a single die, or multiple dies, providing a specific function. The package is usually mounted on a printed circuit board for interconnection with other packaged integrated circuits and discrete components, forming a larger circuit. The term "electronic substrate" refers to any type of substrate to which a single die or multiple dies may be attached and thereby integrated into an assembly or package. An electronic substrate is inclusive of a printed circuit, a package substrate, interposer or other substrate and may include any sort of such substrates including cored or coreless substrates. Here, the term "printed circuit board" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "dielectric" generally refers to any number of non-electrically conductive materials. For purposes of this disclosure, dielectric material may be incorporated into an integrated circuit package as layers of laminate film or as a resin molded over integrated circuit dies mounted on the substrate and/or in other devices as layers or portions of such components.

Here, the term "metallization" generally refers to metal layers formed over and through the dielectric material of the electronic substrate. The metal layers are generally patterned to form metal structures such as traces and bond pads. The metallization of a package substrate may be confined to a single layer or in multiple layers separated by layers of dielectric. The term "electrode" generally refers to a metal or other conductor that couples to a electronic element such as a resistive element, a capacitive element, etc. An electrode may extend to and contact another metal or conductor or to another electronic element. The term "pad" generally refers to metallization structures that terminate integrated traces, vias, etc. of an electronic substrate.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross sectional", "profile" and "plan" correspond to orthogonal planes within a Cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Electronic devices, apparatuses, computing platforms, and methods are described below related to electronic elements such as resistors and capacitors provided within holes or vias of an electronic substrate such as a printed circuit board. Such electronic elements may be characterized as via plug resistors, via plug capacitors, or the like as the electronic element plugs a via of the electronic substrate.

As described above, it may be advantageous to reduce or eliminate the number of surface mounted devices (SMDs) incorporated in an electronic device. As discussed herein, such SMDs may be replaced with via plug electronic elements including via plug resistors and via plug capacitors. In some embodiments, an apparatus such as an electronic device includes an electronic substrate having a via extending at least partially between a first side and an opposing second side of the electronic substrate and a resistive or capacitive element (e.g., an electronic element) within the via. In some embodiments, the via fully extends between the first and second sides and, in such cases, may be characterized as a through hole or through via. Herein, the term via indicates an opening that extends through at least a portion of a substrate such that the via may be filled with an element or material other than the material(s) of the substrate. The via may extend between different layers of the substrate for example and may, in some contexts extend entirely through the substrate. The resistive or capacitive element is contacted by first and second electrodes, which are in turn coupled to traces, pads, or the like of an integrated circuit including the resistor or capacitor formed by the resistive or capacitive element and the electrodes. Such via plug resistors and via plug capacitors may be formed employing materials, dimensions, architectures, and other characteristics that provide a variety of resistive and capacitive characteristics (e.g., resistance values and capacitance values) and other characteristics suitable for integration into the electronic device or system.

Such via plug electronic devices offer a variety of advantages over SMDs including improved reliability, cost savings (by reducing the number of devices as reflected by the bill of materials needed to produce the device), lower environmental impact, and others and such via plug electronic devices may be incorporated into any types of electronic device or system including client segment devices (e.g., laptops, tablets, mobile devices, etc.), desktop computer devices, server devices, and others. It is noted that the via plug electronic devices discussed herein provide miniaturization that is critical for client segment devices but the apparatuses and techniques discussed herein are applicable to any electronic devices. In some contexts, the discussed devices may provide improved environmental sustainability due to fewer pick and place operations, fewer solder joint operations (saving time and energy), and other operations needed for SMD processing as well as reduction of materials and devices that limit recycling. Thereby, replacing SMDs with the via plug resistors and via plug capacitors discussed herein provides lower carbon emission per unit produced, bringing production in line with goals in accordance with the emerging circular economy. Furthermore, the discussed via plug resistors and via plug capacitors improve the proximity of the resistive or capacitive element to the intended use (e.g., load/source), which improves power integrity (PI) and signal integrity (SI) in the resultant device. The discussed devices may also be incorporated as part of a transmission line model (as opposed to being a separate entity in SMD implementations) which improves insertion loss on the transmission lines. The incorporation of via plug resistors and via plug capacitors further reduces electronic substrate area usage saving cost and reducing device form factors. Other advantages will be evident from the following discussion.

Figure 2:
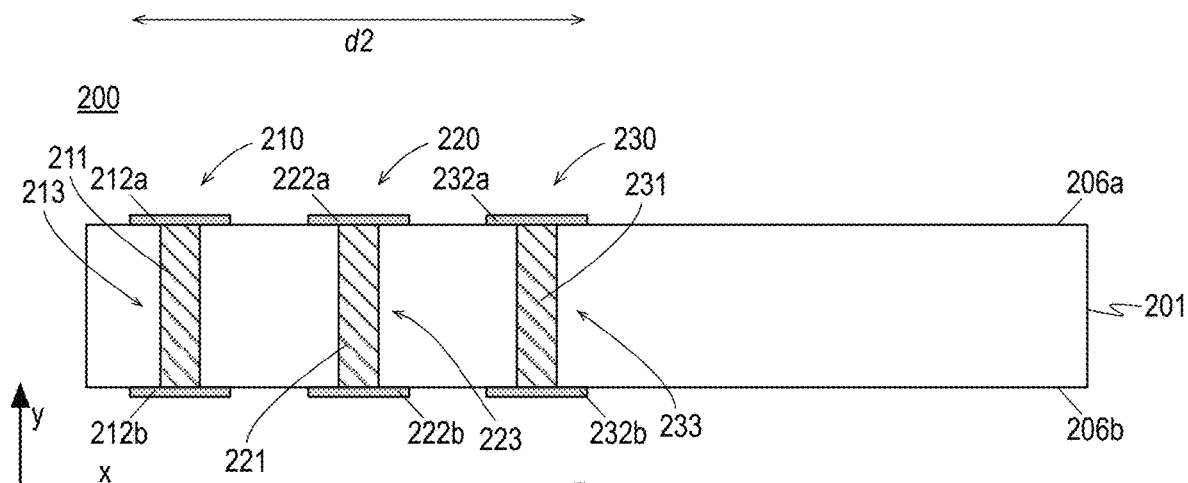
FIG. 2 illustrates a cross-sectional view of an example assembly including example via plug resistors.

FIG. 2 illustrates a cross-sectional view of an example assembly 200 including example via plug resistors 210, 220, 230, arranged in accordance with at least some implementations of the present disclosure. As shown, resistor 210 includes a resistive element 211 within and on a via 213 of electronic substrate 201, and electrodes 212a, 212b in contact with resistive element 211. As used herein, the terms hole and via are used interchangeably. Although typically illustrated herein with respect to through holes or through vias extending entirely through electronic substrate 201, blind vias (i.e., vias extending through one surface of electronic substrate 201 but terminating within electronic substrate 201) or buried vias (i.e., vias having both ends within electronic substrate 201) may be employed. Notably, such vias or holes are fully or partially filled with an electronic element such as a resistive element or a capacitive element. Similarly, resistor 220 includes a resistive element 221 within and on a surface of a via 223 of electronic substrate 201, and electrodes 222a, 222b in contact with resistive element 211 and resistor 230 includes a resistive element 231 within and on a surface of a via 233 of electronic substrate 201, and electrodes 232a, 232b in contact with resistive element 211.

As shown, in some embodiments, vias 213, 223, 233 extend from first side 206a of electronic substrate 201 to an opposing second side 206b of electronic substrate 201. The term opposing indicates second side 206b is opposite and substantially parallel with first side 206a. In some embodiments, one or more of vias 213, 223, 233 extend from first side 206a of electronic substrate 201 to a position within electronic substrate 201 (without extending to second side 206b) or one or more of vias 213, 223, 233 extend from second side 206b of electronic substrate 201 to a position within electronic substrate 201 (without extending to first side 206a). Such vias may be characterized as blind vias. In some embodiments, one or more of vias 213, 223, 233 are fully within electronic substrate 201 (without extending to first side 206a or second side 206b). Such vias may be characterized as buried vias.

Furthermore, in the illustrated example, electrodes 212a, 212b, electrodes 222a, 222b, and electrodes 232a, 232b are formed on or over first and second sides 206a, 206b, respectively. Such implementations may provide an active pad for the coupling of a pin, pad, ball, or the like of an integrated circuit device or other device. However, resistive elements 211, 221, 231 may be contacted by traces on one or both of first and second sides 206a, 206b, or by traces within electronic substrate 201, as discussed further herein below. Furthermore, electrodes 212a, 212b, 222a, 222b, 232a, 232b may be at least partially covered by dielectric layers over first and second sides 206a, 206b. Notably, resistive elements 211, 221, 231 are on or directly adjacent surfaces of vias 213, 223, 233, respectively. As used herein, the terms on or directly adjacent indicate no intervening object or material is therebetween. Notably, resistive elements 211, 221, 231 may include adhesives or multiple material layers, but one of such layers on or directly adjacent to the surface of vias 213, 223, 233 with no conductive material coupling electrodes that are in contact with resistive elements 211, 221, 231. Such conductive material coupling would cause an undesirable short and render resistive elements 211, 221, 231 ineffectual.

Electronic substrate 201 may be any appropriate device, including, but not limited to, a passive substrate (such as a package substrate or interposer, a printed circuit board, or the like) or a combination of an active device (not shown), such as, a microprocessor, a chipset, a graphics device, a wireless device, a memory device, an application specific integrated circuit, combinations thereof, stacks thereof, or the like, embedded in the passive electronic substrate.

Electronic substrate 201 may include a plurality of dielectric material layers (not shown in FIG. 2), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like. Electronic substrate 201 may further include conductive routes or "metallization" (illustrated further herein below) extending through electronic substrate 201.

As discussed, assembly 200 includes resistors 210, 220, 230 at least partially embedded within electronic substrate 201. As shown, resistors 210, 220, 230 require a substantially smaller footprint on assembly 200 (as indicated by distance d2) relative to those required by SMDs 111, 112, 113 (please refer to FIG. 1). Furthermore, although illustrated in FIG. 2 with respect to resistors 210, 220, 230, assembly 200 may include capacitors as discussed further below in place of or in addition to resistors 210, 220, 230.

Resistive elements 211, 221, 231 of resistors 210, 220, 230 may include any resistive materials, dimensions, and characteristics to provide an effective resistance as needed by a circuit employing resistors 210, 220, 230. Such materials, dimensions, and characteristics are discussed further herein below. Notably, resistors 210, 220, 230 may provide the same or different resistance values depending on such materials, dimensions, and characteristics. In some embodiments, one or more of resistors 210, 220, 230 have a resistance of not less than $1\times10^{-7}$ ohm-meters. In some embodiments, resistors 210, 220, 230 provide the same resistance values. In some embodiments, resistors 210, 220, 230 provide different resistance values. For example, resistor 210 may be a 10 ohm resistor, resistor 220 may be a 1 Kohm resistor, and resistor 230 may be a 5 Kohm resistor, although, other resistance values (or ohm ratings) and combinations thereof are available. For example, resistors 210, 220, 230 may provide resistors having a wide range of resistance values (or ohm ratings) such as 0 to 100 Kohm or even higher ratings. For example, the plugging materials of resistive elements 211, 221, 231 and sizes of vias 213, 223, 233 provide a pre-defined resistance for resistors 210, 220, 230 based on circuit design needs.

Furthermore, as shown in FIG. 2, resistive elements 211, 221, 231 may be contacted by electrodes 212a, 212b, electrodes 222a, 222b, and electrodes 232a, 232b, respectively, to form resistors 210, 220, 230. In addition or in the alternative, one or more of resistive elements 211, 221, 231 may be contacted by traces or metallization within electronic substrate 201 to form other resistors.

Figure 3:
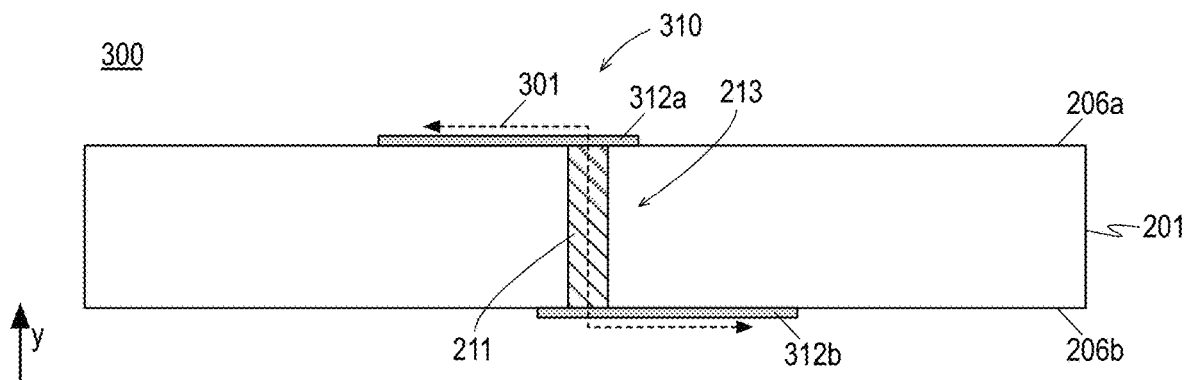
FIG. 3 illustrates a cross-sectional view of an example assembly including an example via plug resistor.

FIG. 3 illustrates a cross-sectional view of an example assembly 300 including an example via plug resistor 310, arranged in accordance with at least some implementations of the present disclosure. As shown, resistor 310 includes resistive element 211 within via 213 of electronic substrate 201, and electrodes 312a, 312b in contact with resistive element 211. In the example of FIG. 3, electrodes 312a, 312b are traces on first and second sides 206a, 206b of electronic substrate 201. Such traces may be provided on one or both of first and second sides 206a, 206b. Furthermore, in other embodiments, traces on one or both of first and second sides 206a, 206b may couple to pads or electrodes as shown in FIG. 2. Also as shown, resistor 310 provides a current routing 301 through electrode 312a, resistive element 211, and electrode 312b. Notably, resistor 310 provides a pre-defined resistance based on the characteristics of resistive element 211. As shown, in some embodiments, electrodes 212a, 222a, 232a are over first side 206a and electrodes 212b, 222b, 232b are over second side 206b of electronic substrate 201.

Figure 4:
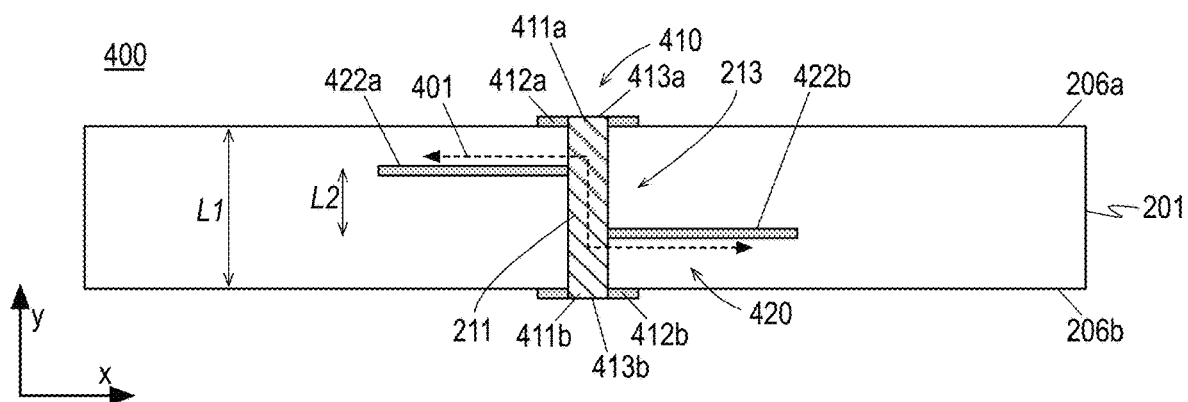
FIG. 4 illustrates a cross-sectional view of an example assembly including multiple example via plug resistors provided by a shared resistive element.

FIG. 4 illustrates a cross-sectional view of an example assembly 400 including multiple example via plug resistors 410, 420 provided by a shared resistive element 211, arranged in accordance with at least some implementations of the present disclosure. As shown, assembly 400 includes resistive element 211 within via 213 of electronic substrate 201. A first resistor 410 is formed by electrode 412a, resistive element 211, and electrode 412b. Although not shown in FIG. 4, a current routing for first resistor 410 extends through electrode 412a, resistive element 211, and electrode 412b in analogy with resistor 310 of FIG. 3. FIG. 4 also illustrates an alternative coupling to resistive element 211 where electrodes 412a, 412b couple to sides of portions 411a, 411b of resistive element 211, which extend above first and second sides 206a, 206b of electronic substrate 201. In addition pads (not shown) may be on one or both of surfaces 413a, 413b of portions 411a, 411b of resistive element 211 to couple outside devices (i.e., a pin or ball of an integrated circuit) to resistive element 211. For example, resistive element 211 may be contacted by any of electrodes 412a, 412b (e.g., surface traces), electrodes 422a, 422b (e.g., internal, blind, or hidden traces), pad electrodes (e.g., in analogy to electrodes 212a, 212b), or covering trace electrodes (e.g., in analogy to electrodes 312a, 312b).

Returning to discussion of first resistor 410, the resistance value (or ohm rating) of first resistor 410 is defined by the characteristics of the current routing (not shown) inclusive of electrode 412a, resistive element 211, and electrode 412b such that the path includes the full length, L1, (or substantially the full length) of resistive element 211.

Also as shown in FIG. 4, a second resistor 420 is formed by internal electrode 422a, a portion of resistive element 211, and internal electrode 422b. Such internal electrodes 422a, 422b may be characterized as metallization layers (or portions thereof), routings (or portions thereof), blind or hidden traces, or the like. A current routing 401 for second resistor 420 extends through electrode 422a, a portion of resistive element 211, and electrode 422b. The resistance value (or ohm rating) of second resistor 420 is defined by the characteristics of current routing 401 inclusive of electrode 412a, resistive element 211, and electrode 412b such that the path includes a segment length, L2, of resistive element 211. Notably, resistive element 211 can be used to provide multiple resistors such as first resistor 410 and second resistor 420 having different resistance values based on the characteristics of the materials, sizes, routings, and so on of the resistors.

In the context of assembly 400, other resistors may be provided using electrodes 412a, 422a, 412b, 422b. For example, another resistor may be provided by a current routing inclusive of electrode 412a, a portion of resistive element 211, and internal electrode 422a, yet another resistor may be provided by a current routing inclusive of electrode 412a, a portion of resistive element 211, and internal electrode 422b, and so on. Such available resistors and routings may provide additional options for miniaturization and integration as access to a surface mounted resistor is not always needed for deployment of a resistor and other routings may be achieved. For example, resistive element 211 may be contacted by any electrode type including pads, traces, blind traces, buried traces, plated through hole traces, or the like.

Figure 5A:
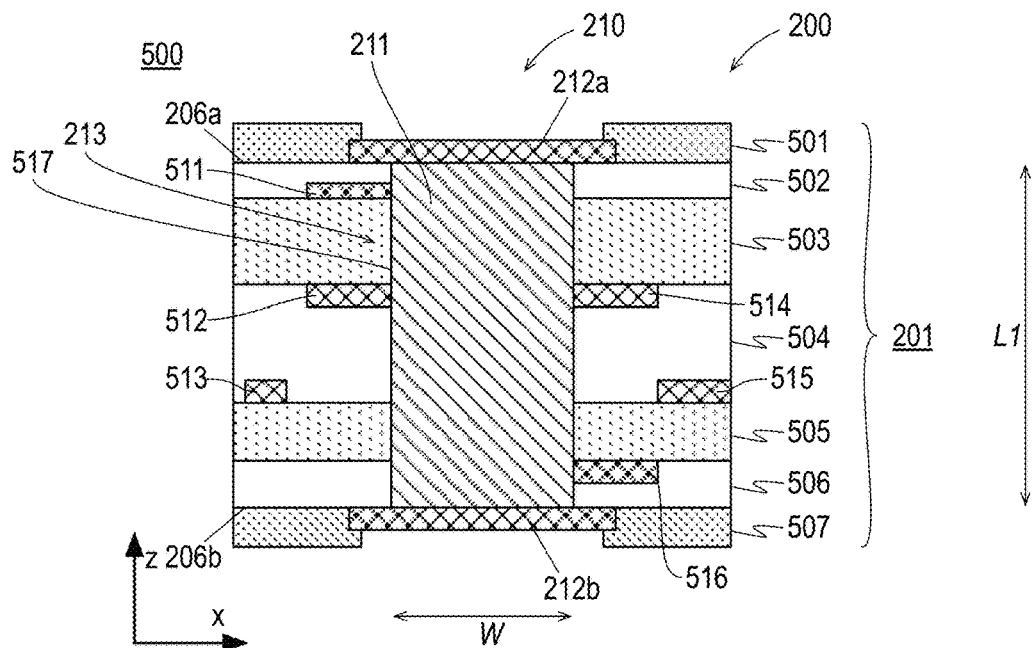
FIG. 5A illustrates a cross-sectional view of a portion of example assembly inclusive of an example via plug resistor.
Figure 5B:
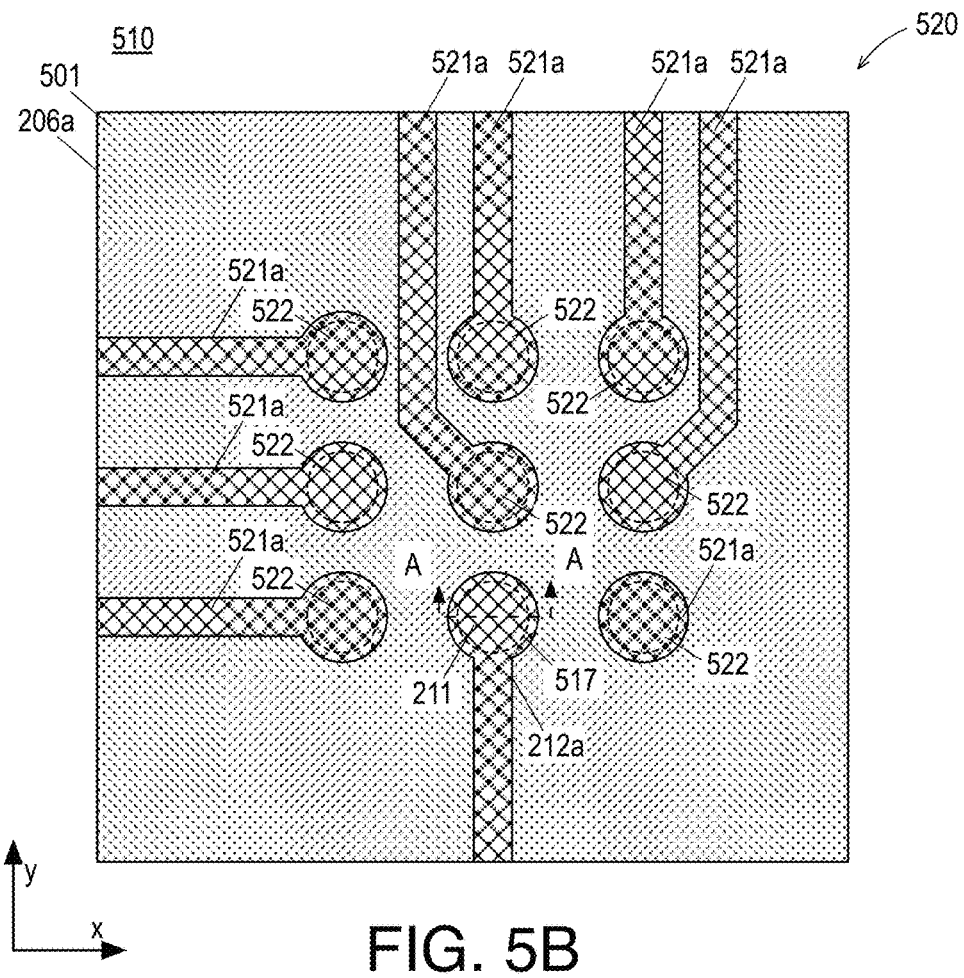
FIG. 5B illustrates a plan view of another portion of the example assembly of FIG. 5A.

FIG. 5A illustrates a cross-sectional view of a portion 500 of example assembly 200 inclusive of example via plug resistor 210 and FIG. 5B illustrates a plan view of another portion 510 of example assembly 200, arranged in accordance with at least some implementations of the present disclosure. For example, FIG. 5A illustrates a cross-sectional view taken along segment A-A in FIG. 5B. As discussed, resistor 210 includes resistive element 211 within via 213 of electronic substrate 201, and electrodes 212a, 212b in contact with resistive element 211. As shown in further detail in FIG. 5A, electronic substrate 201 may include a number of dielectric material layers 501, 502, 503, 504, 505, 506, 507, which may include build-up films, a core (if employed such as dialectic material layer 504 providing a core). Furthermore, electronic substrate 201 may include internal traces or electrodes 511, 512, 513, 514, 515, 516, some of which couple to and are in contact with resistive element 211. For example, internal traces or electrodes 511, 512, 514, 516 couple to and are in contact with resistive element 211 while internal traces or electrodes 513, 515 do not.

Notably, between any combination of electrodes 212a, 212b and internal traces or electrodes 511, 512, 514, 516, no alternative conductive path (outside of a path inclusive of resistive element 211) is provided. That is, the lowest conductive path between any combination of electrodes 212a, 212b and internal traces or electrodes 511, 512, 514, 516 extends through at least a portion of resistive element 211 with all other paths being effectively blocked conductively by one or more of dielectric material layers 501, 502, 503, 504, 505, 506. In some embodiments, dielectric material layers 501, 502, 503, 504, 505, 506 are electrical insulators, electrodes 212a, 212b and internal traces or electrodes 511, 512, 514, 516 are electrical conductors, and resistive element 211 is an electrical resistor. For example, electrical insulators provides little or no current flow (e.g., a relative permittivity of less than about six), electrical conductors provide free current flow (e.g., a electrical resistance of less than about $5 \times 10^{-8}$ ohm-m), and electrical resistors provide restricted flow (e.g., a electrical resistance between about $5 \times 10^{-8}$ ohm-m and $5 \times 10^{-4}$ ohm-m or more). In some embodiments, the electrical resistance of resistive element 211 is greater than the electrical resistance of any of electrodes 212a, 212b and internal traces or electrodes 511, 512, 514, 516.

Furthermore, resistive element 211 is on a sidewall or surface 517 defined by via 213. Notably, surface 517 includes at least a portion of each of dielectric material layers 501, 502, 503, 504, 505, 506 as well as portions of internal traces or electrodes 511, 512, 514, 516 (e.g., those traces meant to contact resistive element 211) with no other material therebetween. It is noted that resistive element 211 may include a resistive adhesive to secure resistive element 211 in via 213 or resistive element 211 may include a material that is inherently secured within via 213. However, in no event does resistive element 211 (or through hole 212) include a material having an electrical resistance less than or equal to that of any of electrodes 212a, 212b and internal traces or electrodes 511, 512, 514, 516. Thereby, a resistive path (of any resistance inclusive of low resistance) is provided between any of electrodes 212a, 212b and internal traces or electrodes 511, 512, 514, 516 without a conductive short, for example).

As shown in FIG. 5B, electrode 212a may be part of an electrical routing or metallization layer 520 inclusive of any number of conductive electrodes, traces, pads, etc. including conductive traces 521a. Furthermore, in FIG. 5B resistive element 211 and surface 517 are shown in hatched outline. One or more of conductive traces 521a may couple to underlying electronic elements 522 such as resistive elements or capacitive elements (as discussed further below). Although illustrated with the same labels for the sake of clarity, each of electronic elements 522 may have differing electronic elements (e.g., resistive elements or capacitive elements) and differing characteristics (e.g., materials, sizes of through holes, etc.) to provide pre-defined electronic characteristics (resistance values, capacitance values, etc.). It is noted that second side 206b may also include an electrical routing or metallization layer. Furthermore, other devices and components (e.g., integrated circuits, passive components, etc.) may be attached to one or both of first side 206a and second side 206b to provide an integrated device or assembly for deployment in a consumer electronics device.

As discussed, resistive element 211 may include any resistive material or materials. In some embodiments, a resistive material of resistive element 211 has a resistance of not less than $1 \times 10^{-7}$ ohm-meters. In some embodiments, a resistive material of resistive element 211 includes copper and nickel. In some embodiments, a resistive material of resistive element 211 is an alloy of copper and nickel. Exemplary resistive materials of copper and nickel are provided in Table 1 and exemplary resistances for such material implementations are provided in Table 2.

TABLE 1

Example Resistive Materials

| Copper Composition (%) | Cu | | Ni | |
|---|---|---|---|---|
| | Weight Percentage (%) | Atomic Percentage (%) | Weight Percentage (%) | Atomic Percentage (%) |
| 50 | 70.20 | 68.52 | 29.80 | 31.48 |
| 60 | 65.20 | 62.30 | 34.80 | 37.70 |
| 70 | 74.61 | 73.09 | 25.39 | 26.91 |
| 80 | 81.41 | 80.19 | 18.59 | 19.81 |

TABLE 2

Example Cu—Ni Compositions and Resistances

| Copper Composition (wt. %) | Resistance (Ω) |
|---|---|
| 50 | 93.43 |
| 60 | 59.51 |
| 70 | 22.67 |
| 80 | 10.48 |

As discussed, resistive element 211 may include any resistive material or materials. In some embodiments, a resistive material of resistive element 211 includes nickel. In some embodiments, a resistive material of resistive element 211 includes chromium. In some embodiments, a resistive material of resistive element 211 includes nickel and chromium (e.g., an alloy of nickel and chromium). In some embodiments, a resistive material of resistive element 211 includes ruthenium. In some embodiments, a resistive material of resistive element 211 includes ruthenium and oxygen (e.g., ruthenium oxide). In some embodiments, a resistive material of resistive element 211 includes iridium. In some embodiments, a resistive material of resistive element 211 includes iridium and oxygen (e.g., iridium oxide). In some embodiments, a resistive material of resistive element 211 includes rhenium. In some embodiments, a resistive material of resistive element 211 includes rhenium and oxygen (e.g., rhenium oxide). In some embodiments, a resistive material of resistive element 211 includes gold. In some embodiments, a resistive material of resistive element 211 includes tin. In some embodiments, a resistive material of resistive element 211 includes or a carbon nanotube epoxy. In some embodiments, a resistive material of resistive element 211 includes carbon sheets. In some embodiments, a resistive material of resistive element 211 includes a resistive epoxy or resistive material epoxy. In some embodiments, resistive element 211 includes a substantially pure form of such materials. In some embodiments, resistive element 211 includes more than one of such materials.

The resultant resistance of a resistor formed between any of electrodes 212a, 212b and internal traces or electrodes 511, 512, 514, 516 will depend on the size and shape of resistive element 211 as well as the material of resistive element 211 and other factors. Resistive element 211 may have any suitable height or total overall length, L1, and any suitable diameter or width, W. In some embodiments, the height or total overall length, L1, of resistive element 211 is approximately equal to the width of electronic substrate 201. In some embodiments, the height or total overall length, L1, of resistive element 211 is in the range of 0.5 to 1.0 mm. In some embodiments, the height or total overall length, L1, of resistive element 211 is in the range of 1.0 to 2.0 mm. In some embodiments, the height or total overall length, L1, of resistive element 211 is in the range of 1.2 to 1.8 mm. In some embodiments, the height or total overall length, L1, of resistive element 211 is in the range of 2.0 to 3.0 mm. In some embodiments, the height or total overall length, L1, of resistive element 211 is in the range of 2.2 to 2.6 mm. Other lengths may be used. In some embodiments, the diameter or width, W, of resistive element 211 is in the range of 0.2 to 0.4 mm. In some embodiments, the diameter or width, W, of resistive element 211 is in the range of 0.4 to 0.8 mm. In some embodiments, the diameter or width, W, of resistive element 211 is in the range of 0.4 to 0.6 mm. In some embodiments, the diameter or width, W, of resistive element 211 is in the range of 0.8 to 1.2 mm. In some embodiments, the diameter or width, W, of resistive element 211 is in the range of 0.6 to 0.8 mm. Other diameters may be used.

Figure 6:
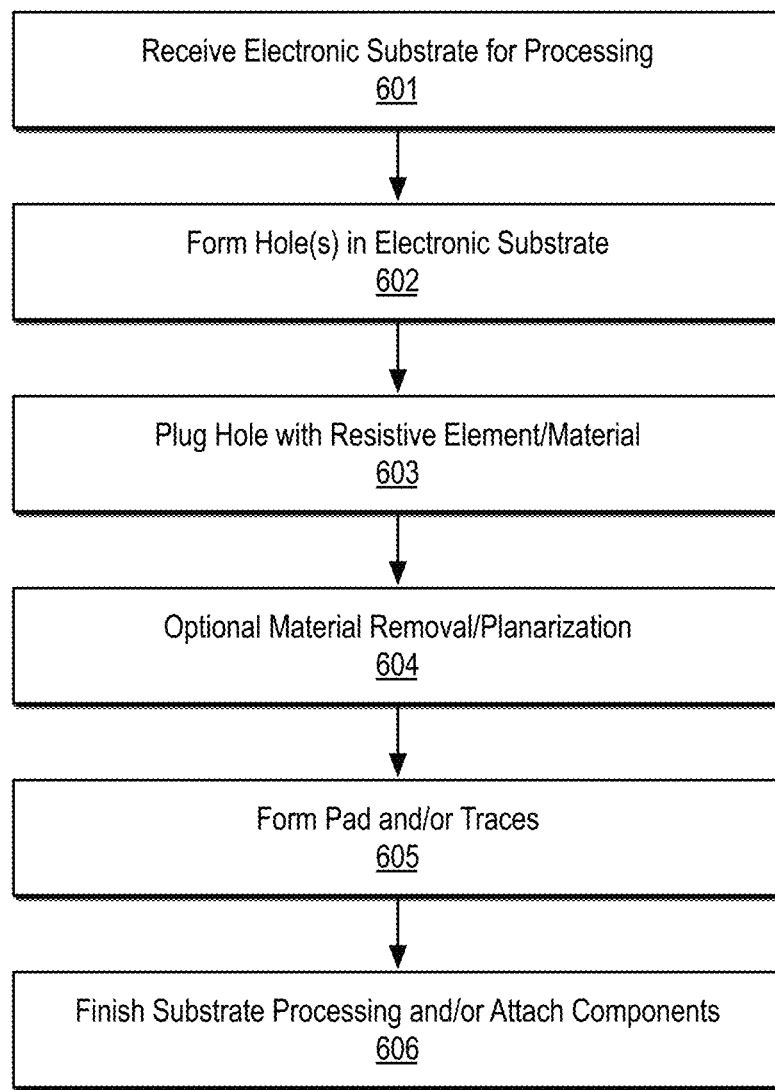
FIG. 6 illustrates a flow diagram illustrating an example process for fabricating via plug resistor structures.

FIG. 6 illustrates a flow diagram illustrating an example process 600 for fabricating via plug resistor structures, arranged in accordance with at least some implementations of the present disclosure. For example, process 600 may be implemented to fabricate assemblies 200, 300, 400 and/or resistors 210, 220, 230 and/or any other resistor structure discussed herein. In the illustrated implementation, process 600 may include one or more operations as illustrated by operations 601-606. However, embodiments herein may include additional operations, certain operations being omitted, or operations being performed out of the order provided.

Process 600 may begin at operation 601, where an electronic substrate is received for processing. The electronic substrate may include any suitable substrate such as a printed circuit board, a package substrate, an interposer, or the like. For example, the received electronic substrate may have any characteristics discussed herein with respect to electronic substrate 201, electronic substrate 701, or any other substrate herein.

Processing may continue at operation 602, where any number of holes are formed in the electronic substrate. The hole or holes may have any size discussed herein and may be formed according to any design or circuit layout or the like. The hole or holes may be formed using any suitable technique or techniques. In some embodiments, the hole or holes are formed by a drilling operation. In some embodiments, the hole or holes are formed by an ablation operation. Notably, the hole or holes formed using such techniques has a sidewall or wall or surface that includes the layer or layers of the electronic substrate exposed during formation of the through hole. The hole or holes may have any cross sectional shape such as circular, square, oval, rectangular, or the like. Such hole or holes may have any characteristics discussed with respect to vias 213, 223, 233.

Processing may continue at operation 603, where the hole or holes formed at operation 602 are plugged with a resistive element and/or material. In some embodiments, each hole is plugged with a resistive element and/or material in accordance with one or more of the following characteristics. In some embodiments, a hole is plugged with a single material or material system (e.g., epoxy with fill, a metal, or metal alloy, etc.). In some embodiments, a hole is plugged with a resistive device or element including any number of resistive materials. For example, a resistive element may have differing materials in layers around a center axis of the resistive element, a resistive element may include different layers of material in a stacked manner along the center axis of the resistive element, and/or the resistive element may be a prefabricated device. Each hole may be filled with the same resistive elements or they may be filled with different resistive elements in accordance with pre-defined resistor requirements of the circuitry being formed.

Each hole is plugged with the resistive element and/or material using any suitable technique or techniques. Notably, such hole plugging may also contact any internal traces or electrodes to the resistive element and/or material. In some embodiments, a hole is plugged with a preformed material plug or preformed resistive element using pick, place, and insertion operations. In some embodiments, such preformed material plugs or resistive elements may be secured using an adhesive. In some embodiments, a hole is plugged or filled using coating techniques, electroplating techniques, dispense techniques, or the like. In some embodiments, the resistive element or material is a plug in solid form. In some embodiments, the resistive element or material is a fill applied in liquid form using a jet printer or the like and subsequently cured at a temperature suitable to solidify the resistive element or material. In some embodiments, such techniques may provide unwanted material over the electronic substrate, which is removed at operation 604. In some embodiments, the through hole is plugged with a resistive material epoxy. In some embodiments, the through hole is plugged using an electrolytic process to plate the through hole with resistive material (e.g., copper nickel alloy, carbon nanotube material or material epoxy, etc.). Such techniques prove the required resistance desired for the circuit being fabricated as discussed herein.

Processing may continue at operation 604, where an optional material removal and/or planarization operations may be performed to remove such unwanted material over the electronic substrate. Such material removal and/or planarization techniques may include any operations that remove the unwanted material and/or provide a substantially planar surface. Such techniques include sanding (e.g., removal via abrasion), etching (e.g., removal using a chemical agent), or the like. In some embodiments, the resistive material is dispensed in the through hole and a sanding or buffing operation is performed to provide substantially planar surfaces on both sides of the electronic substrate.

Processing may continue at operation 605, where pads and/or traces may be formed on the electronic substrate to contact the resistive element and/or material. Such pads and/or traces may be formed using any suitable technique or techniques such as a bulk conductor layer application and subsequent patterning. The pads and/or traces formed using such techniques may have any characteristics discussed herein. Such pads may form active pads for connection of an integrated circuit die, for example.

Processing may continue at operation 606, where electronic substrate processing may be finished by application of additional conductors or electrodes, application of a dielectric layer, application of sealants, application of surface finish, etc. Furthermore, processing may continue with the attachment of one or more integrated circuit dies, one or more passive components, or the like to the electronic substrate to form an assembly. In some embodiments, one or more of the integrated circuit dies or more passive components couple to one or more pads or traces formed at operation 605 such as through a wire bond attachment, flip grid attachment, ball grid attachment, or the like. The assembly formed at operation 606 may be integrated into an electronic device such as a laptop computer, handheld device, tablet, phone, desktop computer, server system, or any other suitable apparatus or system.

Figure 7A:
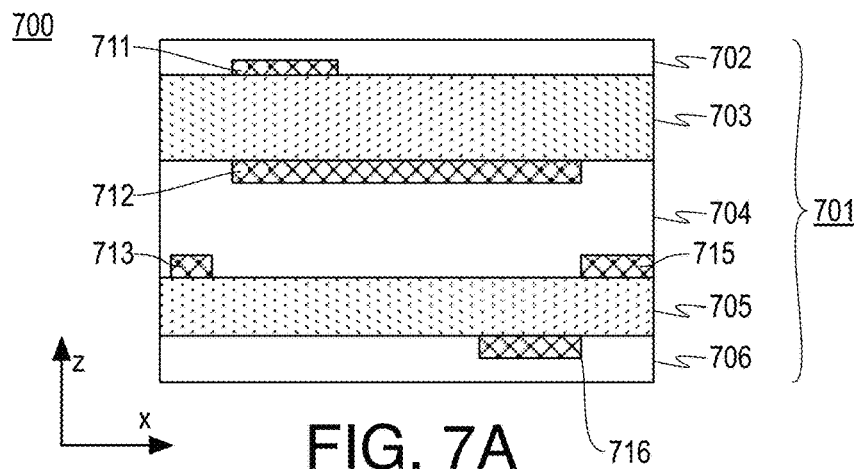
FIGS. 7A, 7B, 7C, 7D, 7E, and 7F illustrate cross-sectional side views of example assembly structures as particular fabrication operations are performed.

FIGS. 7A, 7B, 7C, 7D, 7E, and 7F illustrate cross-sectional side views of example assembly structures as particular fabrication operations are performed, arranged in accordance with at least some implementations of the present disclosure. As shown in FIG. 7A, assembly structure 700 includes a received electronic substrate 701, which may include any number of dielectric material layers 702, 703, 704, 705, 706, which may include build-up films, a core (if employed such as dialectic material layer 704 providing a core) as well as any number of internal metallizations or conductive traces 711, 712, 713, 715, 716. For example, some of such internal conductive traces 711, 712, 713, 715, 716 may be intended to contact a subsequently formed resistive element (i.e., conductive traces 711, 712, 716) and some may not (i.e., conductive traces 713, 715). Furthermore, conductive trace 712 may be split or divided during the formation of the resistive element. Electronic substrate 701 may have any characteristics discussed with respect to electronic substrate 201 or other electronic substrates described herein. In some embodiments, electronic substrate 701 is a printed circuit board. For example, electronic substrate 701 may be received for processing as discussed with respect to operation 601.

Figure 7B:
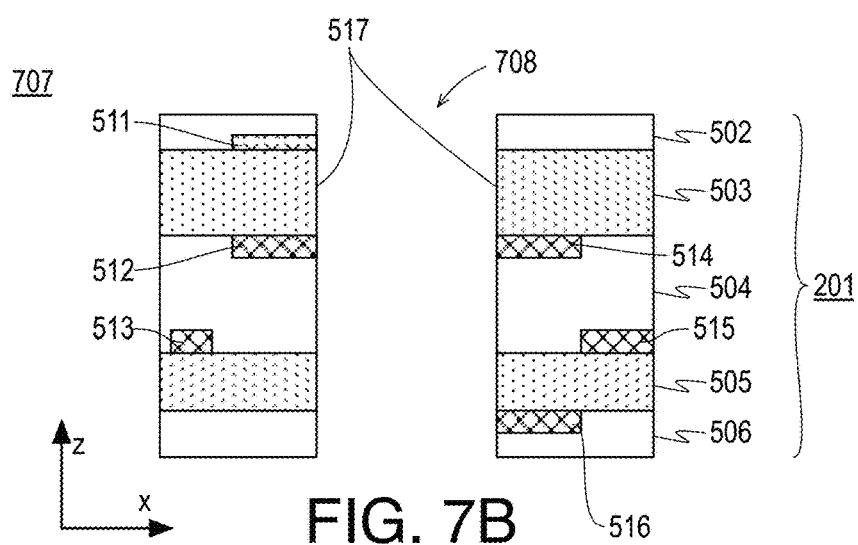

FIG. 7B illustrates an assembly structure 707 similar to assembly structure 700, after the formation of via 708. Via 708 may be formed using any suitable technique or techniques discussed with respect to operation 602 such as drilling techniques, ablation techniques, or the like. As shown, formation of via 708 generates electronic substrate 201 by removal of portions of electronic substrate 701. In some embodiments, as illustrated, via 708 extends entirely through electronic substrate 201. In some embodiments, via 708 extends only partially through electronic substrate 201. As shown, assembly structure 707 includes electronic substrate 201, inclusive of dielectric material layers 502, 503, 504, 505, 506 and internal traces or electrodes 511, 512, 513, 514, 515, 516, 517, as formed after formation of via 708. Furthermore, formation of via 708 exposes surface 517, which includes portions of dielectric material layers 502, 503, 504, 505, 506 and portions of internal traces or electrodes 511, 512, 514, 516. For example, assembly structure 707 may be formed as discussed with respect to operation 602.

Figure 7C:
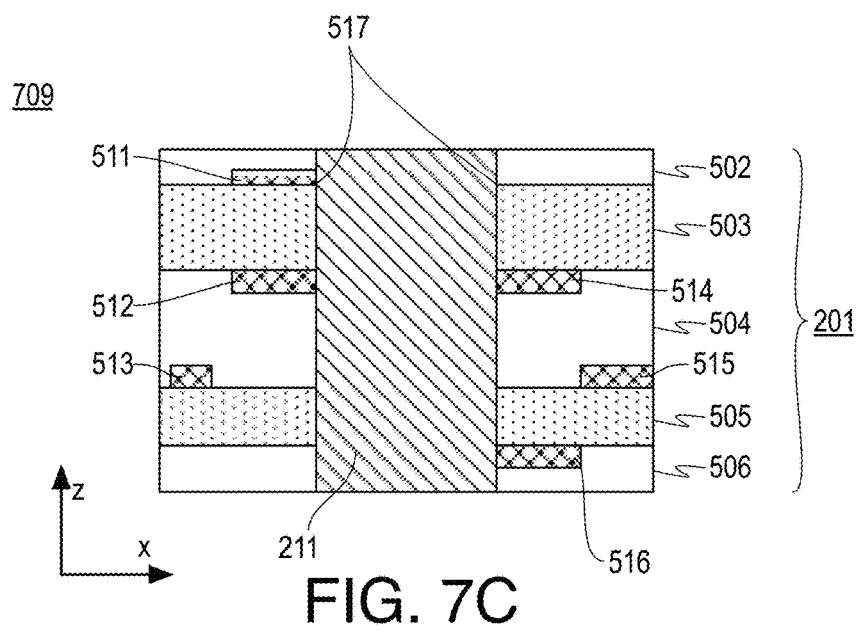

FIG. 7C illustrates an assembly structure 709 similar to assembly structure 707, after the formation of resistive element 211. Resistive element 211 may have any characteristics discussed herein and may be formed using any suitable technique or techniques discussed with respect to operations 603, 604 such as inserting a preformed material plug or preformed resistive element, coating techniques, electroplating techniques, dispense techniques, or liquid application and curing, and optional unwanted material removal techniques such as sanding, etching, or the like. In some embodiments, resistive element 211 is a plug inserted in a solid form. In some embodiments, resistive element 211 is a fill applied in liquid form and subsequently cured to solidify the resistive element or material. Notably, resistive element 211 (e.g., a single resistive material or a number of resistive materials) is formed with a resistive material on and directly adjacent surface 517 without any intervening conductive material. Thereby, resistive pathways are provided between any of internal traces or electrodes 511, 512, 514, 516 and electrodes subsequently formed. Notably, if any intervening conductive material was provided, an undesirable short would occur. As discussed, in some embodiments, every material of resistive element 211 has an electrical resistance greater than that of any material of internal traces or electrodes 511, 512, 514, 516 and electrodes subsequently formed. In low resistance resistor applications, every material of resistive element 211 may have an electrical resistance that is about a factor of ten greater than that of any material of internal traces or electrodes 511, 512, 514, 516. In higher resistance resistor applications the resistance value may be hundreds or thousands time greater than that of any material of internal traces or electrodes 511, 512, 514, 516, or more. It is noted any number of resistive elements may be formed in parallel or in series using such operations to provide resistors having the necessary characteristics for a pre-defined circuit.

Figure 7D:
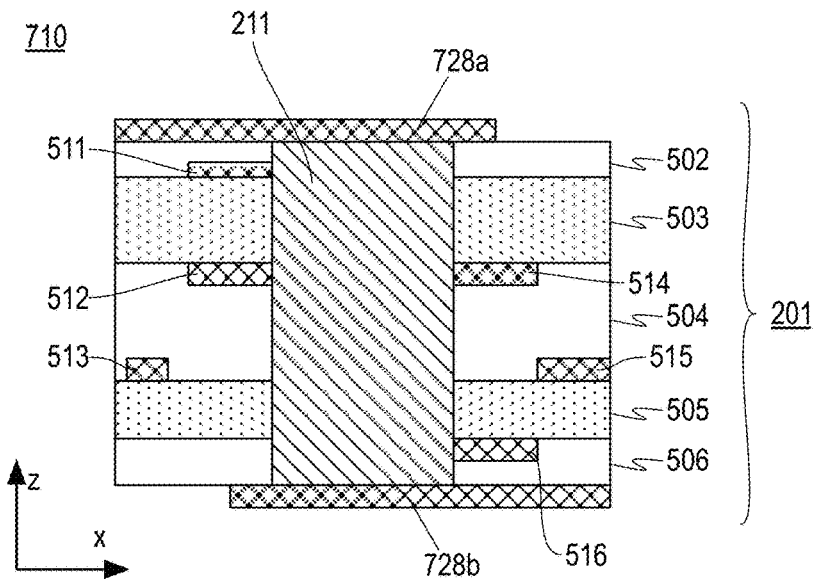

FIG. 7D illustrates an assembly structure 710 similar to assembly structure 709, after the formation of conductive traces or electrodes 728a, 728b. Conductive traces or electrodes 728a, 728b may have any characteristics discussed herein with respect to electrodes 211a, 211b or others, and electrodes 728a, 728b may be formed using any suitable technique or techniques discussed with respect to operation 605. In some embodiments, electrodes 728a, 728b are formed by applying a bulk conductor layer and patterning the bulk conductor layer. Electrode 728a, resistive element 211, and electrode 728b provide a resistor for assembly structure 710. Furthermore, a number of other resistors may be provided by assembly structure 710 such as a resistor including electrode 511, a portion of resistive element 211, and electrode 514, a resistor including electrode 512, a portion of resistive element 211, and electrode 728b, and so on. In some embodiments, other layers of electronic substrate 201 may be formed over resistive element to form a buried via and resistive element as discussed herein.

Figure 7E:
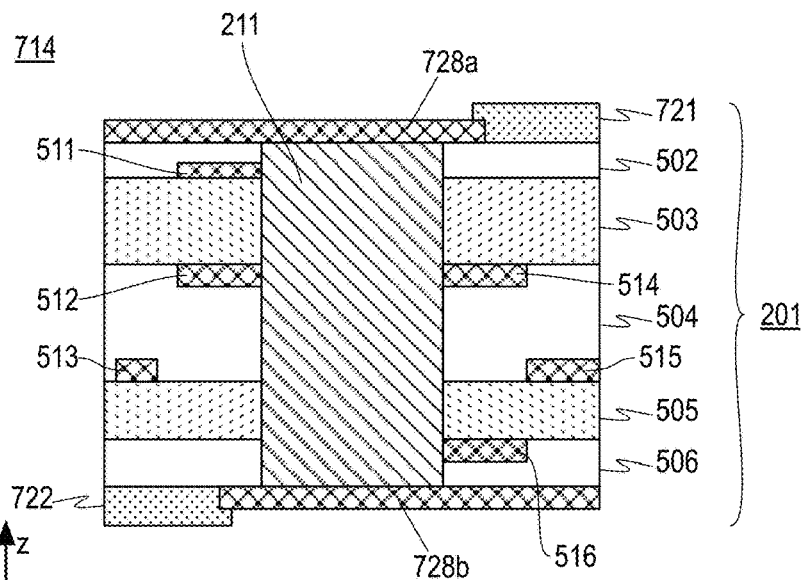

FIG. 7E illustrates an assembly structure 714 similar to assembly structure 710, after the formation of dielectric layers 721, 722. Dielectric layers 721, 722 may provide passivation and/or protection for assembly structure 714. Dielectric layers 721, 722 may be formed using any suitable technique or techniques such as bulk depositing and patterning techniques. For example, dielectric layers 721, 722 may be formed as part of finish processing for assembly structure 714, which may also include formation of interconnect pads, application of surface finish, application of protectants, and the like.

Figure 7F:
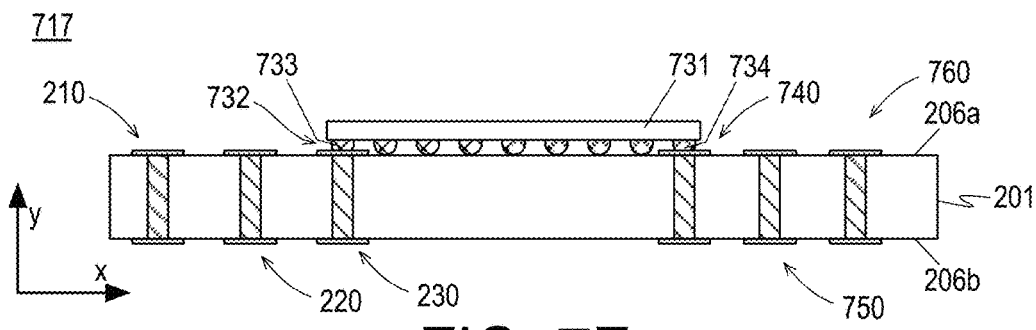

FIG. 7F illustrates an expanded view of an assembly structure 717 similar to assembly structure 714, after the attachment of an integrated circuit die 731 to side 206a of electronic substrate 201 using ball grid array 732. Although illustrated with respect to attachment and coupling using ball grid array 732, die 731 may be attached using any suitable technique or techniques such as wire bonding, field grid arrays, etc. For example, assembly structure 717 may provide an integrated assembly for incorporation into a computing device. In the example of FIG. 7F, assembly structure 717 includes resistors 210, 220, 230 as well as resistors 740, 750, 760, which may have any characteristics as discussed with respect to resistors 210, 220, 230. As discussed, resistors 210, 220, 230, 740, 750, 760 have resistance values or ohm ratings based on their materials, sizes, etc. In some embodiments, one of resistors 210, 220, 230, 740, 750, 760 has a resistance value not less than twice the resistance value of another of resistors 210, 220, 230, 740, 750, 760. In some embodiments, one of resistors 210, 220, 230, 740, 750, 760 has a resistance value not less than five times the resistance value of another of resistors 210, 220, 230, 740, 750, 760. In some embodiments, one of resistors 210, 220, 230, 740, 750, 760 has a resistance value not less than one hundred times the resistance value of another of resistors 210, 220, 230, 740, 750, 760. In some embodiments, one of resistors 210, 220, 230, 740, 750, 760 has a resistance value not less than five hundred times the resistance value of another of resistors 210, 220, 230, 740, 750, 760. Other resistance value ratios may be used.

Furthermore, in the example of FIG. 7F, a first ball 733 of ball grid array 732 is coupled to resistor 230 and a second ball 734 of ball grid array 732 is coupled to resistor 740. However, any suitable connections may be made either directly via a pad (as shown) or through trace routings. Furthermore, as discussed, connection may be made to resistive elements using hidden or internal traces or electrodes. Although illustrated with respect to a single die 731 coupled to side 206a, assembly structure 717 may include additional dies coupled to side 206a, one or more dies coupled to side 206b, and/or other active or passive components coupled to side 206a and/or side 206b. For example, assembly structure 717 includes an electronic substrate (e.g., printed circuit board) having one or more through holes extending through opposing sides thereof and resistive elements having any characteristics discussed herein on or directly adjacent surfaces of the through holes. One or more pairs of electrodes contact the resistive elements to form resistors for one or more circuits. Furthermore, an integrated circuit die is attached to the electronic substrate (e.g., printed circuit board) and coupled to one or more resistors including the resistive elements and electrodes.

Discussion now turns to via plug capacitors, which may be implemented in a manner similar to the discussed via plug resistors. Notably, such via plug capacitors may be prefabricated, embedded into the electronic substrate, and contacted by electrodes. Such via plug capacitors offer a variety of advantages over surface mounted capacitors including miniaturization, sustainability and movement toward the circular economy (e.g., reducing carbon emissions per unit by reducing soldering operations and energy consumption), increased reliability, increased proximity to the intended load or source thereby improving power integrity and signal integrity, incorporation as part of a transmission line model (for improved insertion loss), elimination of plated via inductance on high speed transmission lines further reducing insertion loss, electronic substrate area savings, reduced costs (due to fewer parts being needed), and others.

Figure 8:
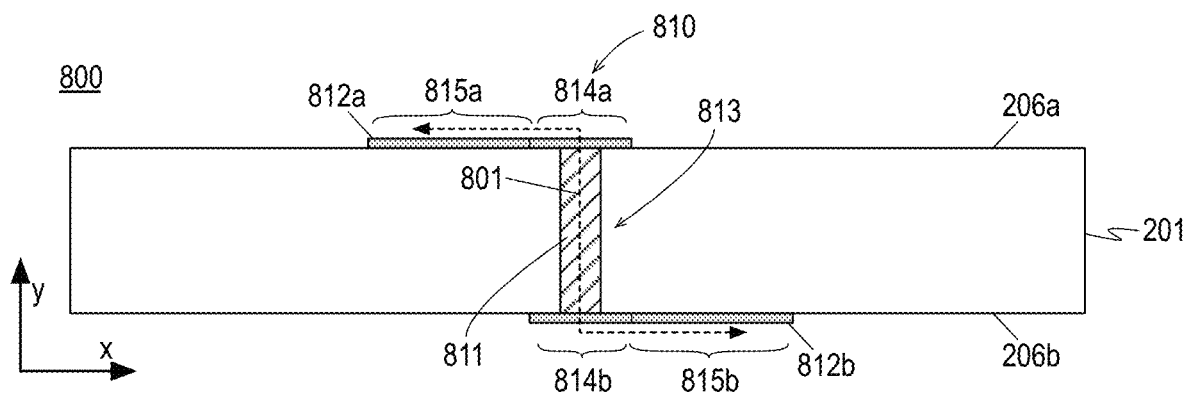
FIG. 8 illustrates a cross-sectional view of an example assembly including an example via plug capacitor.

FIG. 8 illustrates a cross-sectional view of an example assembly 800 including an example via plug capacitor 810, arranged in accordance with at least some implementations of the present disclosure. As shown, capacitor 810 includes a capacitive element 811 within a via 813 of electronic substrate 201. Capacitor 810 also includes at least portions of electrodes 812a, 812b in contact with capacitive element 811. As used herein, the term capacitive element indicates a capacitor or capacitor device that may be coupled by electrodes, traces, pads, or other conductors to provide a capacitor for a circuit. In the context of FIG. 8, capacitive element 811 is illustrated as a single entity or unit for the sake of clarity of presentation. As illustrated further herein with respect to FIGS. 9B, 9C, 9D and elsewhere, capacitive element 811 may include concentric open cylinder conductors separated by dielectric material. Although illustrated with respect to through holes or vias extending entirely through electronic substrate 201, blind vias (i.e., vias extending through one surface of electronic substrate 201 but terminating within electronic substrate 201) or buried vias (i.e., vias having both ends within electronic substrate 201) may be employed with respect to capacitive element 811 being provided therein.

As shown, in some embodiments, via 813 extends from first side 206a to second side 206b of electronic substrate 201. In some embodiments, electrode 812a is on or over first side 206a of electronic substrate 201 and electrode 812b is on or over second side 206b of electronic substrate 201. In other embodiments, one or both of electrodes 812a, 812b may be within electronic substrate 201. As shown, in some embodiments, via 813 extends from first side 206a of electronic substrate 201 to an opposing second side 206b of electronic substrate 201. In some embodiments, via 813 extends from first side 206a of electronic substrate 201 to a position within electronic substrate 201 (without extending to second side 206b) or via 813 extends from second side 206b of electronic substrate 201 to a position within electronic substrate 201 (without extending to first side 206a). Such vias may be characterized as blind vias. In some embodiments, via 813 is fully within electronic substrate 201 (without extending to first side 206a or second side 206b). Such vias may be characterized as buried vias. Furthermore, FIG. 8 illustrates a single capacitor 810, however, any number of capacitors may be employed in analogy with resistors 210, 220, 230 of FIG. 2 and other examples herein. Such capacitors may have the same or different characteristics such as capacitance values, dimensions, etc.

In the embodiment of FIG. 8, electrodes 812a, 812b are traces that extend along first side 206a and second side 206b, respectively, however, other electrodes such as pads may be implemented. In some embodiments, pad portions 814a, 814b (which also may be characterized as electrodes 814a, 814b) and trace portions 815a, 815b are employed such that pad portions 814a, 814b and trace portions 815a, 815b are formed in differing fabrication operations and may employ the same or different conductive materials. In such contexts, pad portions 814a, 814b may be characterized as electrodes. In some embodiments, only pad portions 814a, 814b are employed. In some embodiments, electrodes 812a, 812b are power and ground traces (or ground pads and traces), respectively. In some embodiments, electrodes 812a, 812b are signal traces (or signal pads and traces), respectively.

Electronic substrate 201 may have any characteristics discussed herein such as being a package substrate, interposer, printed circuit board, or the like. For example, electronic substrate 201 may include a plurality of dielectric material layers (not shown in FIG. 8) and conductive routes, traces, or metallization extending through electronic substrate 201. As with assembly 200, assembly 800 provides capacitors such as capacitor 810 using a substantially smaller footprint relative to those required by SMDs 111, 112, 113 (please refer to FIG. 1).

Capacitive element 811 of capacitor 810, as well as capacitive elements of other capacitors, may include any capacitive devices having characteristics to provide an effective capacitance as needed by circuits employing them. For example, the number of conductors (or plates) employed, dimensions, material selections, and the like may be selected to provide pre-defined capacitance values. Also as shown, capacitor 810 provides a current routing 801 through electrode 812a, capacitive element 811, and electrode 812b. Notably, capacitor 810 provides pre-defined capacitance based on the characteristics of resistive element 211.

Figure 9A:
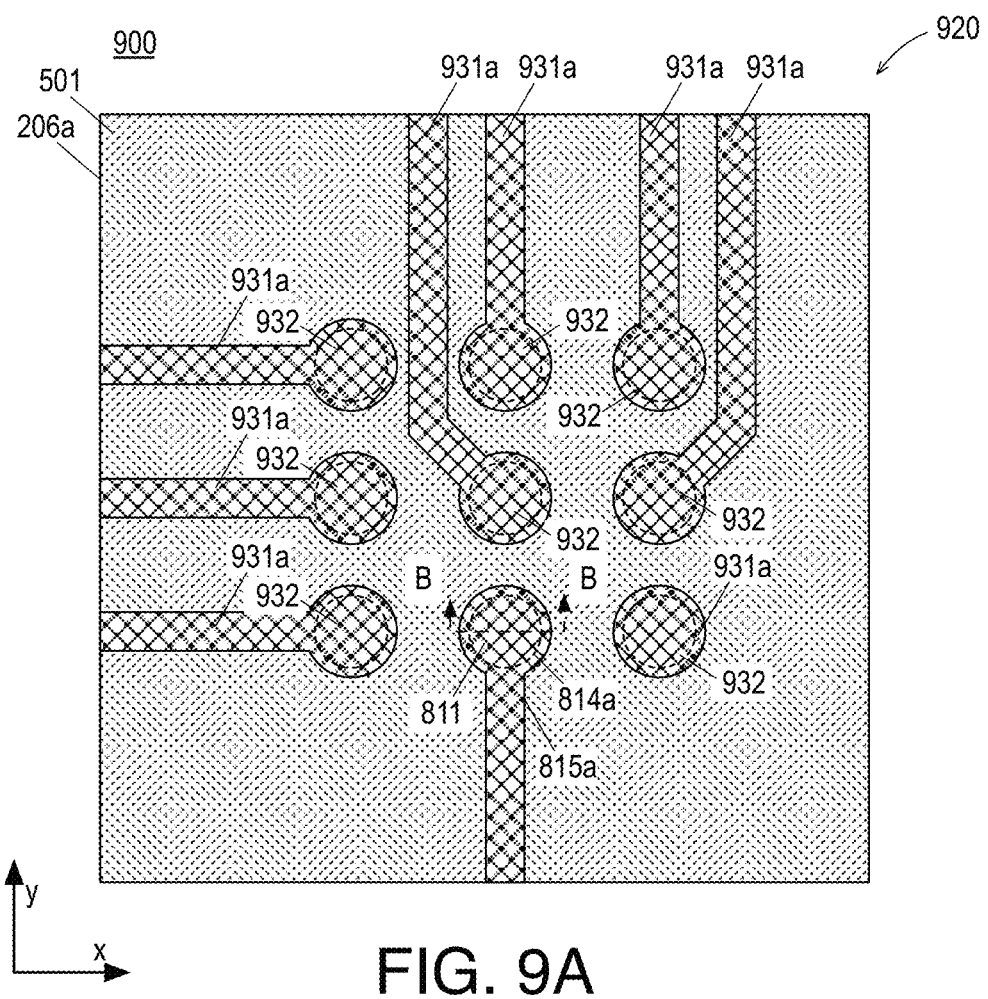
FIG. 9A illustrates a plan view of a portion of example assembly inclusive of an example via plug capacitor.
Figure 9B:
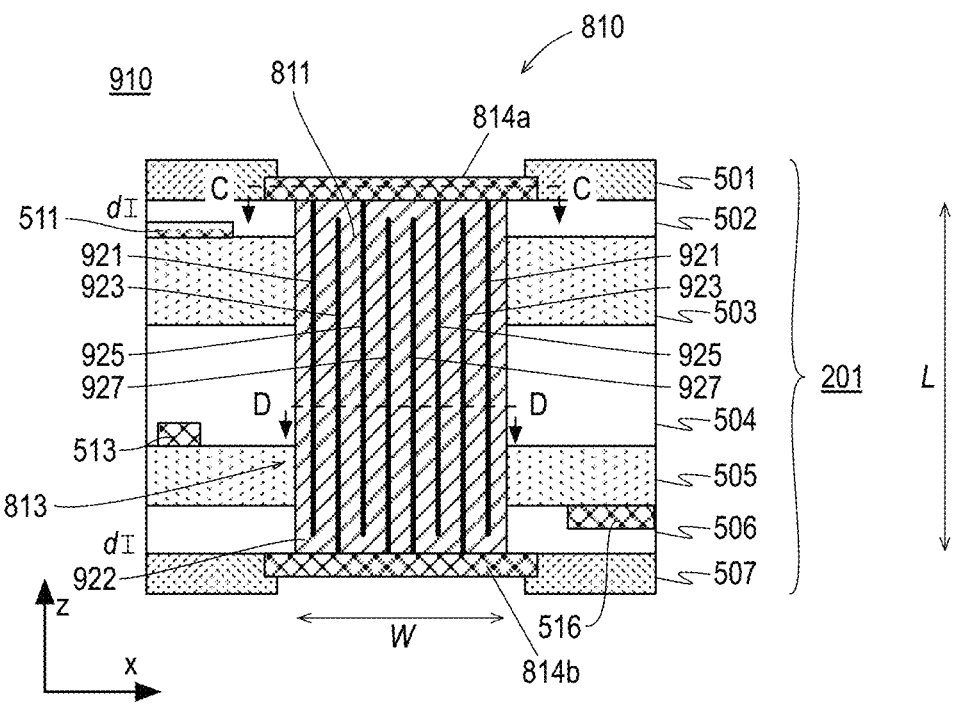
FIG. 9B illustrates a cross-sectional view of a portion of the example assembly of FIG. 9A inclusive of the example via plug capacitor.

FIG. 9A illustrates a plan view of a portion 900 of example assembly 800 inclusive of example via plug capacitor 810 and FIG. 9B illustrates a cross-sectional view of a portion 910 of example assembly 800 inclusive of example capacitor 810, arranged in accordance with at least some implementations of the present disclosure. For example, FIG. 9B illustrates a cross-sectional view taken along segment B-B in FIG. 9A. As discussed, capacitor 810 includes capacitive element 811 within via 813 of electronic substrate 201, and electrodes in contact with capacitive element 811. In the illustrated example, electrodes 814a, 814b are in contact with capacitive element 811.

As shown in FIG. 9A, pad portions 814a and trace portion 815a (shown oriented in the y-dimension in FIG. 9A) may be part of an electrical routing or metallization layer 920 inclusive of any number of conductive electrodes, traces, pads, etc. including conductive traces 931a. In FIG. 9A, capacitive element 811 is shown in hatched outline. One or more of conductive traces 931a may couple to underlying electronic elements 932 such as resistive elements (as discussed above) or capacitive elements inclusive of capacitive element 811. Each of electronic elements 932 may have differing electronic elements (e.g., resistive elements or capacitive elements) and differing characteristics (e.g., materials, sizes of through holes, numbers of capacitive conductors, etc.) to provide pre-defined electronic characteristics (resistance values, capacitance values, etc.). Second side 206b may also include an electrical routing or metallization layer. Furthermore, other devices and components (e.g., integrated circuits, passive components, etc.) may be attached to one or both of first side 206a and second side 206b to provide an integrated device or assembly for deployment in a consumer electronics device.

In FIG. 9B, electronic substrate 201 is illustrated with further detail inclusive of dielectric material layers 501, 502, 503, 504, 505, 506, 507, which may have any characteristic discussed herein such as including build-up films, a core (if employed) and so on. Furthermore, electronic substrate 201 may include internal traces 511, 513, 516. In the example, capacitive element 811 is contacted by electrodes 814a, 814b. In other examples, one or both of electrodes 814a, 814b may be hidden or embedded within electronic substrate 201. However, in contrast to resistive element 211, multiple contacts are not made to capacitive element 811.

As shown, capacitive element 811 includes a number of first conductors 921, 925 electrically coupled to electrode 814a (and electrically insulated from electrode 814b) and a number of second conductors 923, 927 electrically coupled to electrode 814b (and electrically insulated from electrode 814a). Such conductors are separated by and electrically insulated from one another by a dielectric material 922. Although illustrated with respect to a single dielectric material 922 being employed throughout capacitive element 811, multiple different dielectric materials or layers may be employed. In some embodiments, first conductors 921, 925 are power conductors (e.g., part of a power net) and second conductors 923, 927 are ground conductors (e.g., part of a ground net). For example, capacitive element 811 (e.g., a capacitive bar) may be of a cylindrical shape having cylindrical shaped metal electrodes separated by dielectric material as shown below. One set of conductors (which are also characterized as electrodes) connect only to a top electrode pad (or via pad) while the other set of conductors (or electrodes) connect only to a bottom electrode pad (or via pad). Similar structures are applicable for alternating current (AC) coupling capacitors for high speed nets involving vias. Notably, the through hole for capacitive element 811 is non-plated (e.g., not conductor plated) to avoid an electrical short of the top and bottom via pads.

Furthermore, first conductors 921, 925 and second conductors 923, 927 are alternating radially (as shown further below) such that, in operation, electrical energy is stored in an electrical fields between oppositely charged conductors. Such radial alternating between oppositely charged conductors is analogous to interleaving plate conductors. In the illustrated example, four conductors (e.g., conductive plates or shells) are illustrated, however, any number may be used such as two, four, six, eight, or more depending on the desired capacitance and other characteristics of capacitor 810. In some embodiments, such first conductors 921, 925 and second conductors 923, 927 are also concentric or coaxial with respect to one another.

Figure 9C:
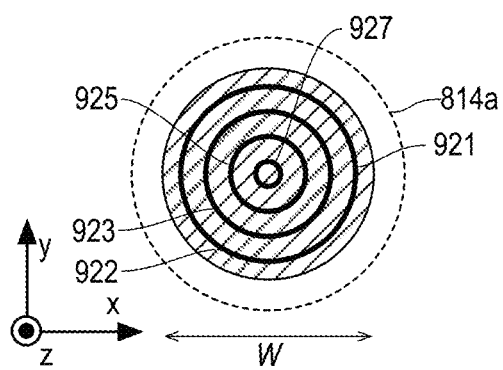
FIG. 9C illustrates a cross-sectional view of the example via plug capacitor taken along an electrode thereof.
Figure 9D:
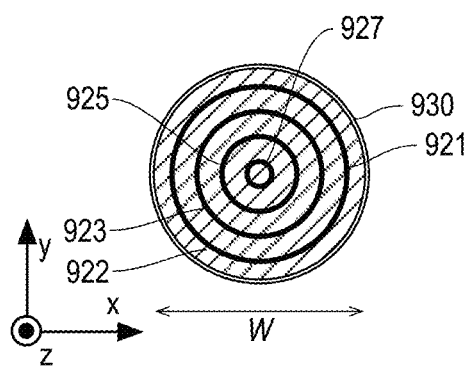
FIG. 9D illustrates another cross-sectional view of the example via plug capacitor taken along a capacitive element 811 thereof.

FIG. 9C illustrates a cross-sectional view of via plug capacitor 810 taken along electrode 814a of via plug capacitor 810 and FIG. 9D illustrates another cross-sectional view of via plug capacitor 810 taken along capacitive element 811 of via plug capacitor 810, arranged in accordance with at least some implementations of the present disclosure. In FIG. 9C, electrode 814a is shown only in outline for the sake of clarity of presentation. Furthermore, in FIG. 9D, an optional adhesive 930 is illustrated. Such adhesive 930 may be employed to further secure capacitive element 811 within via 813.

As shown in both FIGS. 9C and 9D, first conductors 921, 925 and second conductors 923, 927 are each open cylinders that extend (along a central axis of each open cylinder) in the z-direction and have annular cross sections in the x-y plane. As used herein, the term open cylinder indicates a shape having a shell of a cylinder but lacking the circular ends (or fill) of a cylinder and the term annular indicates a ring shape. Also as shown, first conductors 921, 925 and second conductors 923, 927 are substantially concentric or coaxial with respect to one another and with respect to via 813 such that each annular cross section has a substantially shared center and such that each open cylinder extends along a shared center axis.

The thicknesses of the annular cross section of such open cylinders (e.g., a thickness extending from the inside to outside of the annulus) may be any suitable thickness such as a thickness in the range of 100 to 500 microns or more. Such first conductors 921, 925 and second conductors 923, 927 may be any suitable materials. In some embodiments, one or more of first conductors 921, 925 and second conductors 923, 927 include silver. In some embodiments, one or more of first conductors 921, 925 and second conductors 923, 927 include palladium. In some embodiments, one or more of first conductors 921, 925 and second conductors 923, 927 include aluminum. In some embodiments, one or more of first conductors 921, 925 and second conductors 923, 927 include tantalum. Other conductors and/or combinations thereof may be employed. Dielectric material 922 may include one or more dielectric layers or materials. In some embodiments, dielectric material 922 includes an oxide of the conductor material. In some embodiments, dielectric material 922 includes a ceramic material. In some embodiments, dielectric material 922 includes a plastic material In some embodiments, dielectric material 922 includes one or more plastic films. However, any suitable dielectric material(s) may be used.

Capacitive element 811 may have any suitable dimensions such as any dimensions discussed with respect to resistive element 211. For example, the height or total overall length, L, of capacitive element 811 may be in any of the following ranges: 0.5 to 1.0 mm, 1.0 to 2.0 mm, 1.2 to 1.8 mm, 2.0 to 3.0 mm, or 2.2 to 2.6 mm. Similarly, the diameter or width, W, of capacitive element 811 may be in any of the following ranges: 0.2 to 0.4 mm, 0.4 to 0.8 mm, 0.4 to 0.6 mm, 0.8 to 1.2 mm, or 0.6 to 0.8 mm. Other lengths and diameters may be employed. Furthermore, the distance, d, provided between ends of first conductors 921, 925 and electrode 814b and between ends of second conductors 923, 927 and electrode 814b may be any suitable distance to provide electrical insulation such as about 10 to 50 microns.

Figure 10:
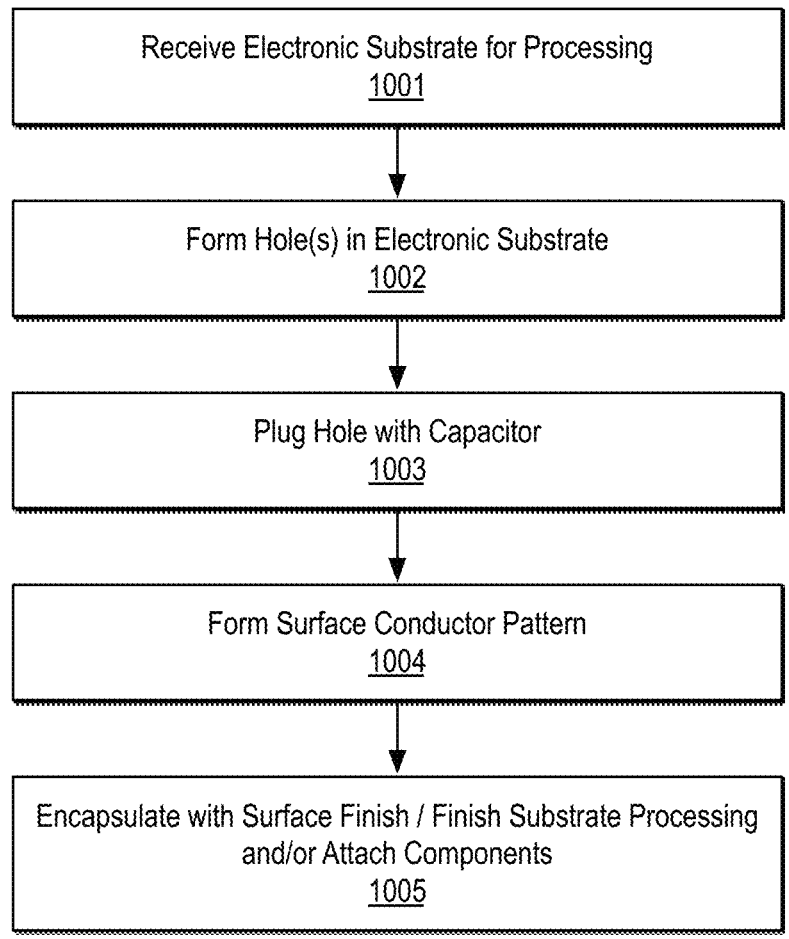
FIG. 10 illustrates a flow diagram illustrating an example process for fabricating via plug capacitor structures.

FIG. 10 illustrates a flow diagram illustrating an example process 1000 for fabricating via plug capacitor structures, arranged in accordance with at least some implementations of the present disclosure. For example, process 1000 may be implemented to fabricate assembly 800 and/or capacitor 810 and/or any other capacitor structure discussed herein. In the illustrated implementation, process 1000 may include one or more operations as illustrated by operations 1001-1005. However, embodiments herein may include additional operations, certain operations being omitted, or operations being performed out of the order provided.

Process 1000 may begin at operation 1001, where an electronic substrate is received for processing. The electronic substrate may include any suitable substrate such as a printed circuit board, a package substrate, an interposer, or the like. For example, the received electronic substrate may have any characteristics discussed herein with respect to electronic substrate 201, electronic substrate 1101, or any other electronic substrate herein.

Processing may continue at operation 1002, where any number of holes are formed in the electronic substrate in any manner such as using techniques discussed with respect to operation 602. The hole or holes may have any size discussed herein and may be formed according to any design or circuit layout or the like. In some embodiments, the hole or holes are formed by a drilling operation. In some embodiments, the hole or holes are formed by an ablation operation. Notably, the hole or holes formed using such techniques has a sidewall or wall or surface that includes the layer or layers of the electronic substrate. The hole or holes may have any cross sectional shape such as circular, square, oval, rectangular, or the like.

Processing may continue at operation 1003, where the hole or holes formed at operation 1002 are plugged with a capacitive element. In some embodiments, the capacitive element is prefabricated in a separate operation. For example, the materials of the capacitive element may be cut and formed to shape and assembled to form a prefabricated capacitive element that may be contacted by electrodes. In some embodiments, each hole is plugged with a capacitive element.

Each hole may be plugged with a same type of capacitive element or one or more holes may be plugged with capacitive elements of differing characteristics. Such elements are pre-designed and selected according to the needs of the circuitry being fabricated. In some embodiments, each capacitive element may be picked, placed, and inserted into the corresponding through hole. In some embodiments, one or more capacitive elements are secured in place with an adhesive material such as epoxy.

Processing may continue at operation 1004, where pads and/or traces may be formed on the electronic substrate to contact the capacitive element elements. Such pads and/or traces may be formed using any suitable technique or techniques such as a patterning of a bulk conductive layer. For example, the pads and/or traces formed using such techniques may have any characteristics discussed herein and may be formed according to a predefined circuit pattern.

Processing may continue at operation 1005, where electronic substrate processing may be finished by application of additional conductors or electrodes, application of a dielectric layer, encapsulation with a surface finish, application of sealants, etc. Furthermore, processing may continue with the attachment of one or more integrated circuit dies, one or more passive components, or the like to the electronic substrate to form an assembly. In some embodiments, one or more of the integrated circuit dies or more passive components couple to one or more pads or traces formed at operation 1004 such as through a wire bond attachment, flip grid attachment, ball grid attachment, or the like. The assembly formed at operation 606 may be integrated into an electronic device such as a laptop computer, handheld device, tablet, phone, desktop computer, server system, or any other suitable apparatus or system.

Figure 11A:
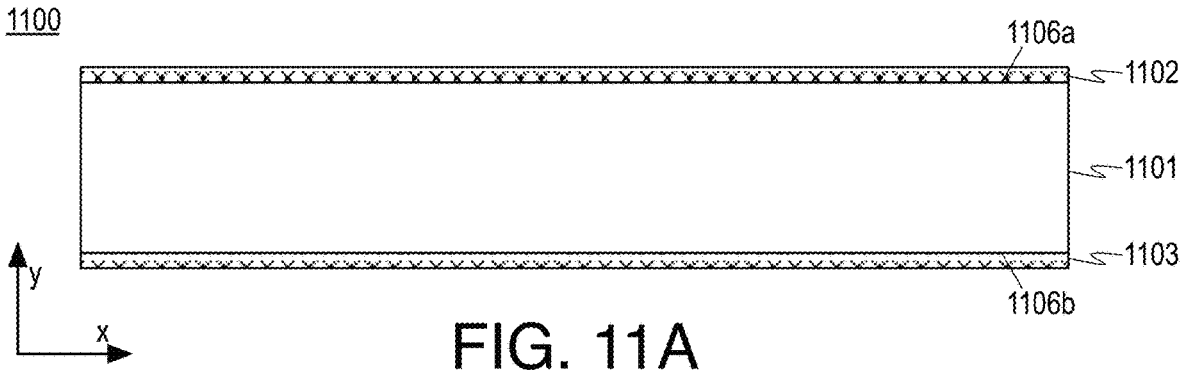
FIGS. 11A, 11B, 11C, 11D, 11E, and 11F illustrate cross-sectional side views of example assembly structures as particular fabrication operations are performed.

FIGS. 11A, 11B, 11C, 11D, 11E, and 11F illustrate cross-sectional side views of example assembly structures as particular fabrication operations are performed, arranged in accordance with at least some implementations of the present disclosure. As shown in FIG. 11A, assembly structure 1100 includes a received electronic substrate 1101 and metallization layers 1102, 1103 on or over first and second sides 1106a, 1106b, respectively of electronic substrate 1101.

Electronic substrate 1101 may include any number of dielectric material layers and internal metallizations or conductive traces as discussed with respect to electronic substrate 201 or other electronic substrates. In some embodiments, electronic substrate 1101 is a printed circuit board. Metallization layers 1102, 1103 may include any suitable metal materials. In some embodiments, metallization layers 1102, 1103 are copper layers.

Figure 11B:
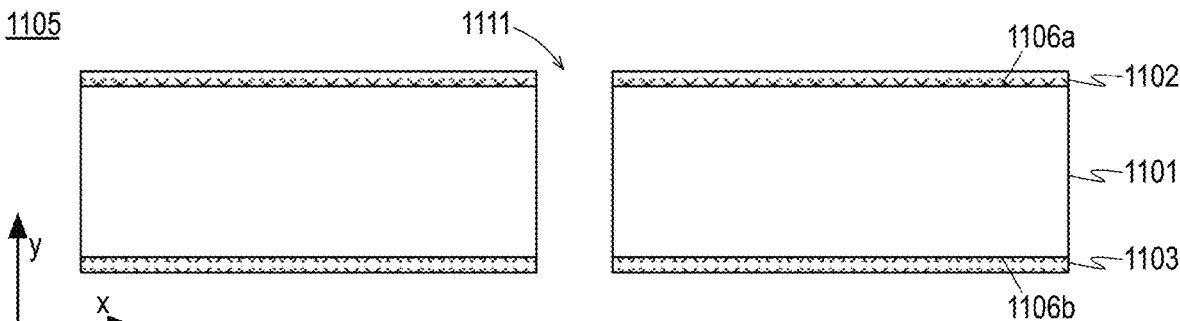

FIG. 11B illustrates an assembly structure 1105 similar to assembly structure 1100, after the formation of via or via 1111. Via 1111 may be formed using any suitable technique or techniques discussed with respect to operation 1102 such as drilling techniques, ablation techniques, or the like. As shown, formation of via 1111 removes portions of metallization layers 1102, 1103 and electronic substrate 1101. In some embodiments, as illustrated, via 1111 extends entirely through electronic substrate 1101. In some embodiments, via 1111 extends only partially through electronic substrate 1101.

Figure 11C:
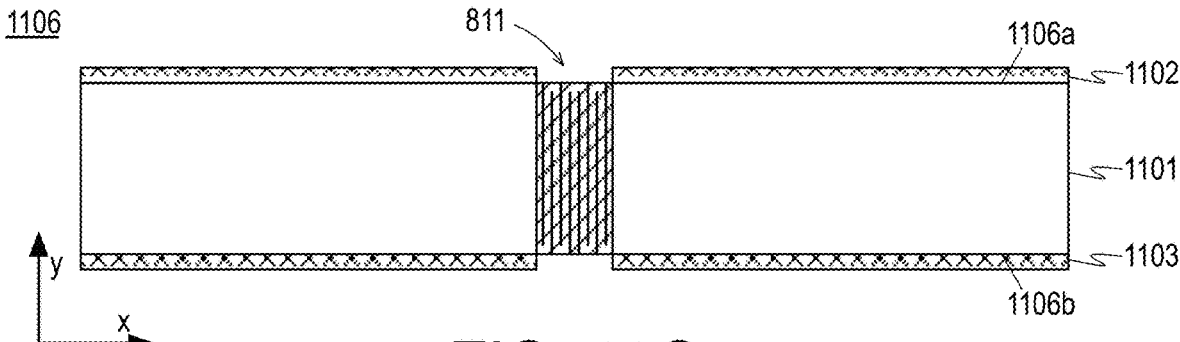

FIG. 11C illustrates an assembly structure 1106 similar to assembly structure 1105, after the insertion of capacitive element 811. Capacitive element 811 may have any characteristics discussed herein and may be inserted using any suitable technique or techniques discussed with respect to operation 1003 such as inserting a preformed capacitive element. In some embodiments, one or both of capacitive element 811 and sidewalls of via 1111 are coated in an adhesive prior to insertion to secure capacitive element 811 after cure of the adhesive. In some embodiments, no adhesive is applied and capacitive element 811 mechanically within via 1111.

Figure 11D:
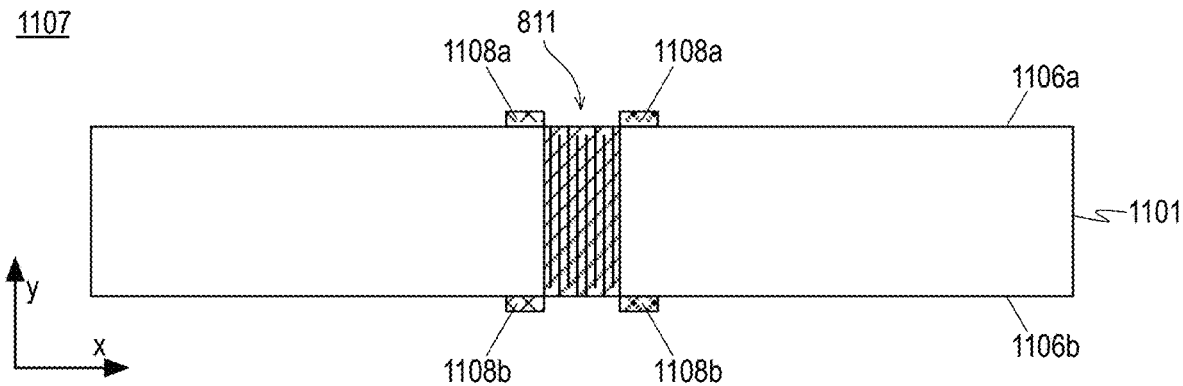

FIG. 11D illustrates an assembly structure 1107 similar to assembly structure 1106, after the formation of conductive traces 1108a, 1108b. Conductive traces 1108a, 1108b may have any characteristics discussed herein and may be formed using any suitable technique or techniques. In some embodiments, conductive traces 1108a, 1108b are formed by patterning metallization layers 1102, 1103. For example, patterning and etch techniques and/or develop techniques may be employed. In some embodiments, other layers of electronic substrate 101 may be formed over resistive element to form a buried via and capacitive element as discussed herein.

Figure 11E:
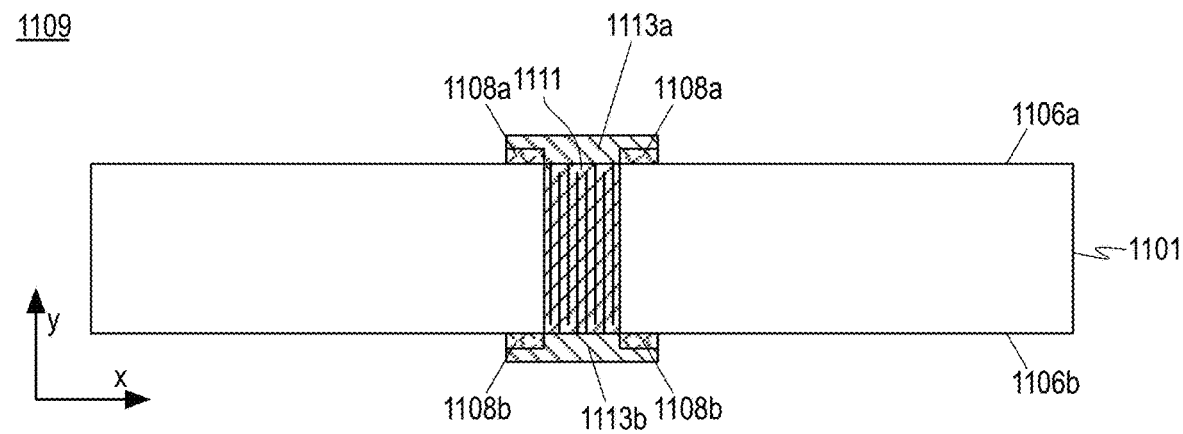

FIG. 11E illustrates an assembly structure 1109 similar to assembly structure 1107, after the formation of conductive pads 1113a, 1113b. Conductive pads 1113a, 1113b may have any characteristics discussed herein and may be formed using any suitable technique or techniques. In some embodiments, conductive pads 1113a, 1113b via encapsulation with a surface finish, bulk metallization deposition and patterning techniques, or the like.

Figure 11F:
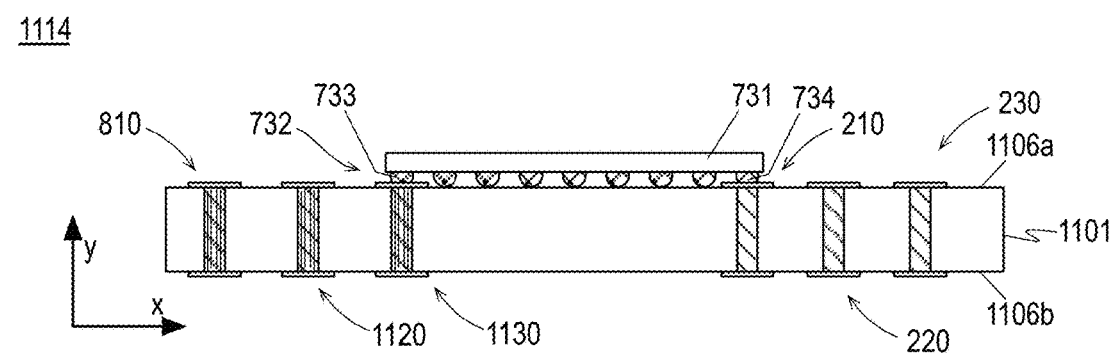

FIG. 11F illustrates an expanded view of an assembly structure 1114 similar to assembly structure 1109, after the attachment of die 731 to side 1106a of electronic substrate 201 using ball grid array 732. Although illustrated with respect to attachment and coupling using ball grid array 732, die 731 may be attached using any suitable technique or techniques such as wire bonding, field grid arrays, etc. Assembly structure 1114 may provide an integrated assembly for incorporation into a computing device. In the example of FIG. 11F, assembly structure 1114 includes capacitor 810 as well as capacitors 1120, 1130, which may have any characteristics as discussed with respect to capacitor 810. Furthermore, assembly structure 1114 includes resistors 210, 220, 230, which may have any characteristics discussed herein. In some embodiments, one of capacitors 810, 1120, 1130 has a capacitance value not less than twice the capacitance value of another of capacitors 810, 1120, 1130. In some embodiments, one of capacitors 810, 1120, 1130 has a capacitance value not less than five times the capacitance value of another of capacitors 810, 1120, 1130. In some embodiments, one of capacitors 810, 1120, 1130 has a capacitance value not less than ten times the capacitance value of another of capacitors 810, 1120, 1130. Other capacitance value ratios may be used.

Furthermore, in the example of FIG. 11F, first ball 733 of ball grid array 732 is coupled to capacitor 1130 and a second ball 734 of ball grid array 732 is coupled to resistor 210. However, any suitable connections may be made either directly via a pad (as shown) or through trace routings. Although illustrated with respect to a single die 731 coupled to side 1106a, assembly structure 1114 may include additional dies coupled to side 106a, one or more dies coupled to side 1106b, and/or other active or passive components coupled to side 1106a and/or side 1106b. For example, assembly structure 1114 includes an electronic substrate (e.g., printed circuit board) having one or more through holes extending through opposing sides thereof and capacitive elements having any characteristics discussed herein within the through holes. One or more pairs of electrodes contact the capacitive elements to form capacitors for one or more circuits. Furthermore, an integrated circuit die is attached to the electronic substrate (e.g., printed circuit board) and coupled to one or more capacitive including the capacitive elements and electrodes.

Figure 12:
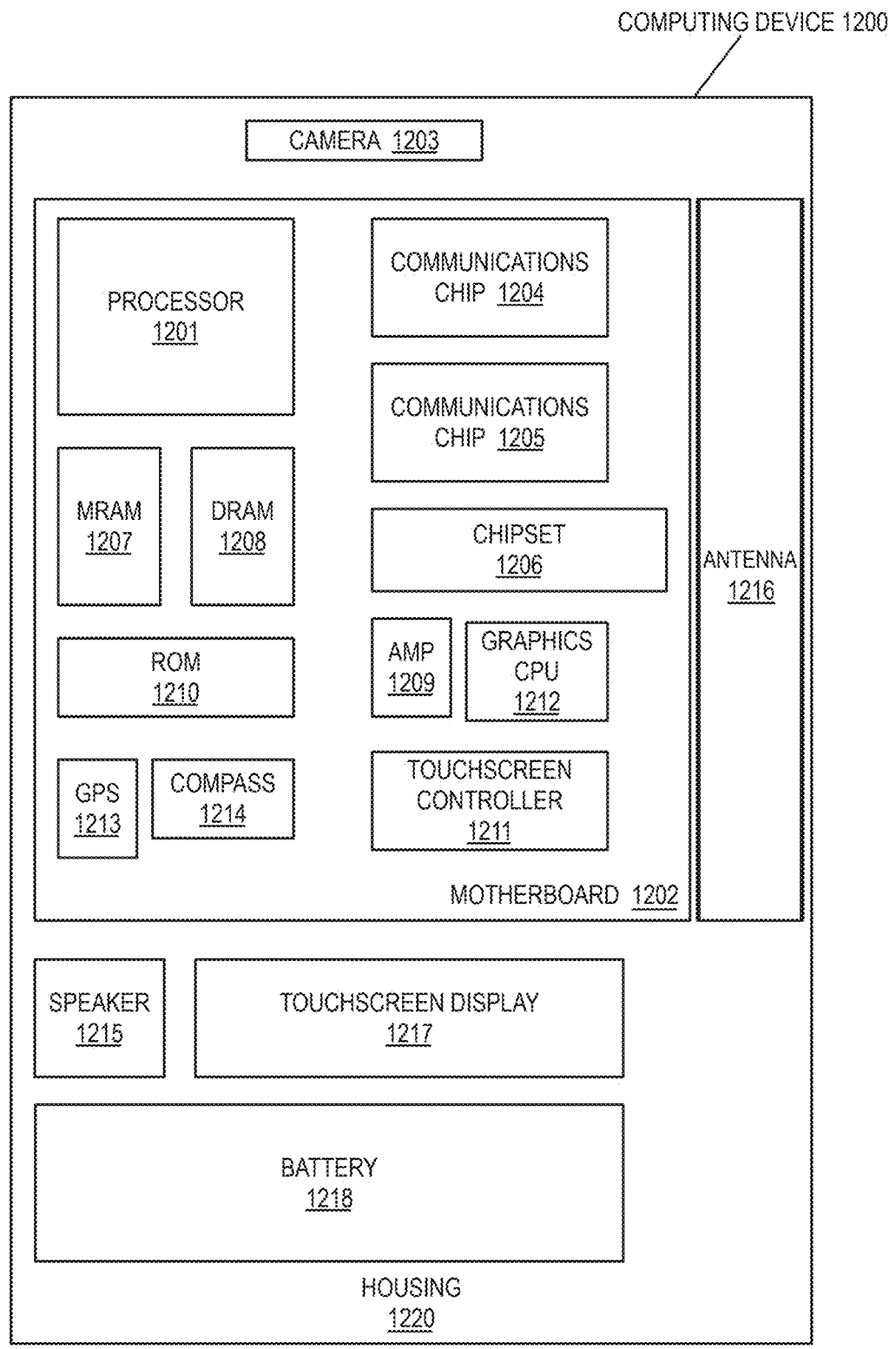
FIG. 12 is a functional block diagram of an electronic or computing device, all arranged in accordance with at least some implementations of the present disclosure.

FIG. 12 is a functional block diagram of an electronic or computing device 1200, arranged in accordance with at least some implementations of the present disclosure. Electronic computing device 1200 may employ via plug resistor and/or a via plug capacitor as discussed herein. Computing device 1200 may be found inside a platform or a server machine, for example, and may computing device 1200 may be provided in any suitable form factor device. In various implementations, computing device 1200 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, computing device 1200 may be any other electronic device that processes data.

As shown, computing device 1200 may include a housing 1220 and a motherboard 1202 therein hosting a number of components, such as, but not limited to, a processor 1201 (e.g., an applications processor). Processor 1201 may be physically and/or electrically coupled to motherboard 1202. In some embodiments, motherboard 1202 includes a via plug resistor and/or a via plug capacitor as discussed herein. In some examples, processor 1201 includes an integrated circuit die packaged within the processor 1201. In general, the term "processor" or "microprocessor" may refer to any device or portion of a device that processes electronic data from registers and/or memory to transform that electronic data into other electronic data that may be further stored in registers and/or memory.

In various examples, one or more communication chips 1204, 1205 may also be physically and/or electrically coupled to the motherboard 1202. In further implementations, communication chips 1204, 1205 may be part of processor 1201. Depending on its applications, computing device 1200 may include other components that may or may not be physically and electrically coupled to motherboard 1202. These other components include, but are not limited to, volatile memory (e.g., MRAM 1207, DRAM 1208), non-volatile memory (e.g., ROM 1210), flash memory, a graphics processor 1212, a digital signal processor, a crypto processor, a chipset 1206, an antenna 1216, touchscreen display 1217, touchscreen controller 1211, battery 1218, audio codec, video codec, power amplifier 1209, global positioning system (GPS) device 1213, compass 1214, accelerometer, gyroscope, audio speaker 1215, camera 1203, and mass storage device (such as hard disk drive, solid-state drive (SSD), compact disk (CD), digital versatile disk (DVD), and so forth), or the like.

Communication chips 1204, 1205 may enable wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1206 may implement any of a number of wireless standards or protocols, including but not limited to those described elsewhere herein. As discussed, computing device 1200 may include a plurality of communication chips 1204, 1205. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

In an embodiment, at least one of the integrated circuit components of computing device 1200 includes an electronic substrate having a via plug resistor and/or a via plug capacitor as discussed herein.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

The term "processor" may refer to any device or portion of a device that processes electronic data from registers and/or memory to transform that electronic data into other electronic data that may be stored in registers and/or memory.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

In one or more first embodiments, an apparatus comprises an electronic substrate comprising a via extending at least partially between a first side and an opposing second side of the electronic substrate, a capacitive element within the via, and first and second electrodes coupled to the capacitive element.

In one or more second embodiments, further to the first embodiment, the capacitive element comprises a first conductor in contact with the first electrode and a second conductor in contact with the second electrode and separated from the first conductor by a dielectric material.

In one or more third embodiments, further to the first or second embodiments, the first and second conductors comprise substantially open cylinders each extending substantially orthogonal to the first side and each having first and second substantially annular cross sections, respectively.

In one or more fourth embodiments, further to any of the first through third embodiments, the first annular cross section, the second annular cross section, and the via are substantially concentric.

In one or more fifth embodiments, further to any of the first through fourth embodiments, the dielectric material comprises a ceramic material.

In one or more sixth embodiments, further to any of the first through fifth embodiments, the capacitive element comprises a plurality of first substantially open cylinder conductors in contact with the first electrode and a plurality of second substantially open cylinder conductors alternating radially with the plurality of first substantially open cylinder conductors and in contact with the second electrode.

In one or more seventh embodiments, further to any of the first through sixth embodiments, the apparatus further comprises a second capacitive element within a second via of the electronic substrate and third and fourth electrodes coupled to the second capacitive element.

In one or more eighth embodiments, further to any of the first through seventh embodiments, the first and second electrodes and the capacitive element comprise a first capacitor having a first capacitance value and the third and fourth electrodes and the second capacitance element comprise a second capacitor having a second capacitance value not less than twice the first capacitance value.

In one or more ninth embodiments, further to any of the first through eighth embodiments, the first and second electrodes comprise first and second pads over the first and second sides of the electronic substrate, respectively.

In one or more tenth embodiments, further to any of the first through ninth embodiments, the capacitive element is on a surface of the via.

In one or more eleventh embodiments, further to any of the first through tenth embodiments, the apparatus comprises an integrated circuit die attached to the electronic substrate and coupled to a capacitor comprising the first and second electrodes and the capacitive element via the first electrode.

In one or more twelfth embodiments, an electronic system comprises a printed circuit board comprising a via extending at least partially between a first side and an opposing second side of the printed circuit board, a capacitive element within the via, and first and second electrodes coupled to the capacitive element, and an integrated circuit die attached to the printed circuit board and coupled to a capacitor comprising the first and second electrodes and the capacitive element via the first electrode.

In one or more thirteenth embodiments, further to the twelfth embodiment, the printed circuit board further comprises a second capacitive element within a second via of the printed circuit board and third and fourth electrodes coupled to the second capacitive element, the integrated circuit die coupled to a second capacitor comprising the third and fourth electrodes and the second capacitive element.

In one or more fourteenth embodiments, further to the twelfth or thirteenth embodiments, the capacitive element comprises a first conductor in contact with the first electrode and a second conductor in contact with the second electrode and separated from the first conductor by a dielectric material, wherein the first and second conductors comprise substantially open cylinders each extending substantially orthogonal to the first side and each having first and second substantially annular cross sections, respectively.

In one or more fifteenth embodiments, further to the twelfth through fourteenth embodiments, the second capacitive element comprises a plurality of third substantially open cylinder conductors in contact with the third electrode and a plurality of fourth substantially open cylinder conductors alternating radially with the plurality of third substantially open cylinder conductors and in contact with the fourth electrode.

In one or more sixteenth embodiments, further to the twelfth through fifteenth embodiments, the first and second electrodes comprise first and second pads over the first and second sides of the electronic substrate, respectively, and wherein a ball of a ball grid array couples the integrated circuit die and the first pad.

In one or more seventeenth embodiments, a method comprises providing a via at least partially through an electronic substrate, forming a capacitive element within the via, and coupling first and second electrodes to the capacitive element to form a capacitor comprising the first and second electrodes and the capacitive element.

In one or more eighteenth embodiments, further to the seventeenth embodiment, forming capacitive element within the via comprises inserting a prefabricated capacitive element into the via.

In one or more nineteenth embodiments, further to the seventeenth or eighteenth embodiments, the method further comprises providing an adhesive between a surface of the via and the capacitive element.

In one or more twentieth embodiments, further to any of the seventeenth through nineteenth embodiments, the capacitive element comprises a first conductor in contact with the first electrode and a second conductor in contact with the second electrode and separated from the first conductor by a dielectric material, wherein the first and second conductors comprise substantially open cylinders each extending substantially orthogonal to the first side and each having first and second substantially annular cross sections, respectively.

In one or more twenty-first embodiments, further to any of the seventeenth through twentieth embodiments, the capacitive element comprises a plurality of first substantially open cylinder conductors in contact with the first electrode and a plurality of second substantially open cylinder conductors alternating radially with the plurality of first substantially open cylinder conductors and in contact with the second electrode.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An apparatus, comprising:
   an electronic substrate comprising a via extending at least partially between a first side and an opposing second side of the electronic substrate;
   a capacitive element within the via;
   a first electrode and a second electrode coupled to the capacitive element, the capacitive element comprising:
     a first conductor in contact with the first electrode;
     a second conductor in contact with the second electrode; and
     a dielectric material between the first conductor and the second conductor, wherein the first or the second conductor comprises a metal comprising one of silver, palladium, or tantalum and the dielectric material comprises an oxide of the metal; and
   an adhesive between and directly on the capacitive element and a surface of the via, wherein the adhesive is directly on the dielectric material of the capacitive element, and wherein the first electrode comprises a pad over the first side of the electronic substrate, the pad in contact with the adhesive.

2. The apparatus of claim 1, wherein the adhesive is an epoxy.

3. The apparatus of claim 1, wherein the first conductor and the second conductor comprise substantially open cylinders each extending substantially orthogonal to the first side, the first conductor having a first substantially annular cross section and the second conductor having a second substantially annular cross section.

4. The apparatus of claim 3, wherein a first thickness of the first annular cross section extending from an inside to an outside of the first annular cross section and a second thickness of the second annular cross section extending from an inside to an outside of the second annular cross section are not less than 100 microns.

5. The apparatus of claim 3, wherein the capacitive element has a length extending orthogonal to the first side of not less than 1.0 mm and a diameter along the first side and within the via of not less than 0.4 mm.

6. The apparatus of claim 1, further comprising:
   a second capacitive element within a second via of the electronic substrate; and
   third and fourth electrodes coupled to the second capacitive element, the first and second electrodes and the capacitive element comprise a first capacitor having a first capacitance value and the third and fourth electrodes and the second capacitance element comprise a second capacitor having a second capacitance value not less than twice the first capacitance value.

7. The apparatus of claim 1, wherein the electronic substrate comprises a plurality of substrate dielectric material layers, and at least one conductive route extending through the substrate dielectric material layers of the electronic substrate.

8. The apparatus of claim 1, further comprising:
   an integrated circuit die attached to the electronic substrate and coupled to a capacitor comprising the first electrode, the second electrode, and the capacitive element.

9. An apparatus, comprising:
   an electronic substrate comprising a via extending at least partially between a first side and an opposing second side of the electronic substrate;
   a capacitive element within the via; and
   a first electrode and a second electrode coupled to the capacitive element, the capacitive element comprising:
     a first conductor in contact with the first electrode;
     a second conductor in contact with the second electrode; and
     a dielectric material between the first conductor and the second conductor, wherein the first or the second conductor comprises a metal comprising one of silver, palladium, or tantalum and the dielectric material comprises an oxide of the metal, wherein the first conductor and the second conductor comprise substantially open cylinders each extending substantially orthogonal to the first side, the first conductor having a first substantially annular cross section and the second conductor having a second substantially annular cross section, and wherein a first thickness of the first annular cross section extending from an inside to an outside of the first annular cross section and a second thickness of the second annular cross section extending from an inside to an outside of the second annular cross section are not less than 100 microns.

10. The apparatus of claim 9, further comprising:
    an adhesive between and directly on the capacitive element and a surface of the via.

11. The apparatus of claim 10, wherein the adhesive is an epoxy.

12. The apparatus of claim 9, wherein the capacitive element has a length extending orthogonal to the first side of not less than 1.0 mm and a diameter along the first side and within the via of not less than 0.4 mm.

13. The apparatus of claim 9, further comprising:
a second capacitive element within a second via of the electronic substrate; and
third and fourth electrodes coupled to the second capacitive element, the first and second electrodes and the capacitive element comprise a first capacitor having a first capacitance value and the third and fourth electrodes and the second capacitance element comprise a second capacitor having a second capacitance value not less than twice the first capacitance value.

14. The apparatus of claim 9, wherein the electronic substrate comprises a plurality of substrate dielectric material layers, and at least one conductive route extending through the substrate dielectric material layers of the electronic substrate.

15. The apparatus of claim 9, further comprising:
an integrated circuit die attached to the electronic substrate and coupled to a capacitor comprising the first electrode, the second electrode, and the capacitive element.

16. An apparatus, comprising:
an electronic substrate comprising a via extending at least partially between a first side and an opposing second side of the electronic substrate;
a capacitive element within the via; and
a first electrode and a second electrode coupled to the capacitive element, the capacitive element comprising:
a first conductor in contact with the first electrode;
a second conductor in contact with the second electrode; and
a dielectric material between the first conductor and the second conductor, wherein the first or the second conductor comprises a metal comprising one of silver, palladium, or tantalum and the dielectric material comprises an oxide of the metal, wherein the first conductor and the second conductor comprise substantially open cylinders each extending substantially orthogonal to the first side, the first conductor having a first substantially annular cross section and the second conductor having a second substantially annular cross section, and wherein the capacitive element has a length extending orthogonal to the first side of not less than 1.0 mm and a diameter along the first side and within the via of not less than 0.4 mm.

17. The apparatus of claim 16, further comprising:
an adhesive between and directly on the capacitive element and a surface of the via.

18. The apparatus of claim 17, wherein the adhesive is an epoxy.

19. The apparatus of claim 16, further comprising:
a second capacitive element within a second via of the electronic substrate; and
third and fourth electrodes coupled to the second capacitive element, the first and second electrodes and the capacitive element comprise a first capacitor having a first capacitance value and the third and fourth electrodes and the second capacitance element comprise a second capacitor having a second capacitance value not less than twice the first capacitance value.

20. The apparatus of claim 16, wherein the electronic substrate comprises a plurality of substrate dielectric material layers, and at least one conductive route extending through the substrate dielectric material layers of the electronic substrate.

21. The apparatus of claim 16, further comprising:
an integrated circuit die attached to the electronic substrate and coupled to a capacitor comprising the first electrode, the second electrode, and the capacitive element.

* * * * *